US012720918B2

(12) United States Patent
Pan et al.

(10) Patent No.: US 12,720,918 B2
(45) Date of Patent: Aug. 25, 2026

(54) SEMICONDUCTOR DEVICE HAVING SEMICONDUCTOR STRUCTURE WITH HOLES

(71) Applicant: Ennostar Corporation, Hsinchu City (TW)

(72) Inventors: Po-Chou Pan, Hsinchu (TW); Shih-Chang Lee, Hsinchu (TW); Wei-Jen Hsueh, Hsinchu (TW); Sheng-Feng Kuo, Hsinchu (TW)

(73) Assignee: Ennostar Corporation, Hsinchu City (TW)

( * ) Notice: Subject to any disclaimer, the term of this patent is extended or adjusted under 35 U.S.C. 154(b) by 742 days.

(21) Appl. No.: 17/869,582

(22) Filed: Jul. 20, 2022

(65) Prior Publication Data

US 2023/0027930 A1 Jan. 26, 2023

(30) Foreign Application Priority Data

Jul. 22, 2021 (TW) ................................ 110127032

(51) Int. Cl.
*H10H 20/831* (2025.01)

(52) U.S. Cl.
CPC ............................... *H10H 20/8312* (2025.01)

(58) Field of Classification Search
CPC ................................ H01S 5/11; H01L 25/167
USPC ........................................................... 257/79
See application file for complete search history.

(56) References Cited

U.S. PATENT DOCUMENTS 7,535,946 B2 5/2009 Nagatomo et al.
7,978,745 B2 7/2011 Noda et al.
8,149,892 B2 4/2012 Nagatomo et al.
9,130,348 B2 9/2015 Noda et al.
2004/0247009 A1 12/2004 Noda et al.
2009/0074024 A1* 3/2009 Noda .................. G11B 7/0903 372/50.12
2010/0103972 A1* 4/2010 Saito ...................... B82Y 20/00 372/50.1
2010/0142578 A1* 6/2010 Hoshino ............. H01S 5/32341 372/45.01

(Continued)

FOREIGN PATENT DOCUMENTS

CN 103038959 B 8/2015
TW 201344948 A 11/2013
TW M593068 U 4/2020

OTHER PUBLICATIONS

Yoshida et al., *Experimental Investigation of Lasing Modes in Double-Lattice Photonic-Crystal Resonators and Introduction of In-Plane Heterostructures*, Proceedings of the IEEE, 2019, 8 pages.

*Primary Examiner* — Ratisha Mehta
*Assistant Examiner* — Mikka Liu
(74) *Attorney, Agent, or Firm* — MUNCY, GEISSLER, OLDS & LOWE, P.C.

(57) ABSTRACT

A semiconductor device is provided, which includes a substrate, a first semiconductor structure, a plurality of first holes, a first dielectric structure and a second semiconductor structure. The first semiconductor structure is located on the substrate. The first holes are periodically arranged in the first semiconductor structure. The first dielectric structure is filled in one or more of the first holes. The second semiconductor structure is located on the first semiconductor structure.

19 Claims, 15 Drawing Sheets

1

(56) References Cited

U.S. PATENT DOCUMENTS

| | | | | |
|---|---|---|---|---|
| 2013/0039375 A1* | 2/2013 | Noda | H01S 5/04256 | |
| | | | 372/44.01 | |
| 2017/0201069 A1* | 7/2017 | Hitaka | H01S 5/34313 | |
| 2021/0184430 A1* | 6/2021 | Noda | H01S 5/34333 | |

* cited by examiner

SEMICONDUCTOR DEVICE HAVING SEMICONDUCTOR STRUCTURE WITH HOLES

CROSS REFERENCE TO RELATED APPLICATIONS

This application claims the right of priority based on TW application Serial No. 110127032, filed on Jul. 22, 2021, which is incorporated by reference herein in their entirety.

FIELD OF DISCLOSURE

The present disclosure relates to a semiconductor device and in particular to a semiconductor device such as a light-emitting device.

BACKGROUND OF THE DISCLOSURE

Semiconductor devices are widely used in many applications. Various researches and developments of related material used in the semiconductor devices have been conducted. For example, a group III-V semiconductor material containing a group III element and a group V element may be applied to various optoelectronic devices, such as light emitting diodes (LEDs), laser diodes (LDs), photoelectric detectors, solar cells or power devices, such as switches or rectifiers. LEDs or LDs have high efficiency and long operating lifetime, and is therefore widely used. With the development of technology, there are still many technical needs for various semiconductor devices. For example, the application of photonic crystal in semiconductor devices still needs further improvements in producing process, structure or material.

SUMMARY OF THE DISCLOSURE

The present disclosure provides a semiconductor device. The semiconductor device includes a substrate, a first semiconductor structure, a plurality of first holes, a first dielectric structure, a second semiconductor structure, a first electrode and a second electrode. The first semiconductor structure is located on the substrate. The first holes are periodically arranged in the first semiconductor structure. The first dielectric structure is filled in one or more of the first holes. The second semiconductor structure is located on the first semiconductor structure. The first electrode is located on the second semiconductor structure. The second electrode is located under the substrate. The first electrode and the second electrode are not overlapped in a vertical direction.

The present disclosure further provides a semiconductor device. The semiconductor device includes a substrate, a first semiconductor structure, a plurality of first holes, a first dielectric structure and a second semiconductor structure. The first semiconductor structure is located on the substrate. The first holes are periodically arranged in the first semiconductor structure. The first dielectric structure is filled in one or more of the first holes. The second semiconductor structure is located on the first semiconductor structure. The first dielectric structure includes a first dielectric layer having a first refractive index and a second dielectric layer having a second refractive index different from the first refractive index.

DETAILED DESCRIPTION OF THE DISCLOSURE

Figure 1A:
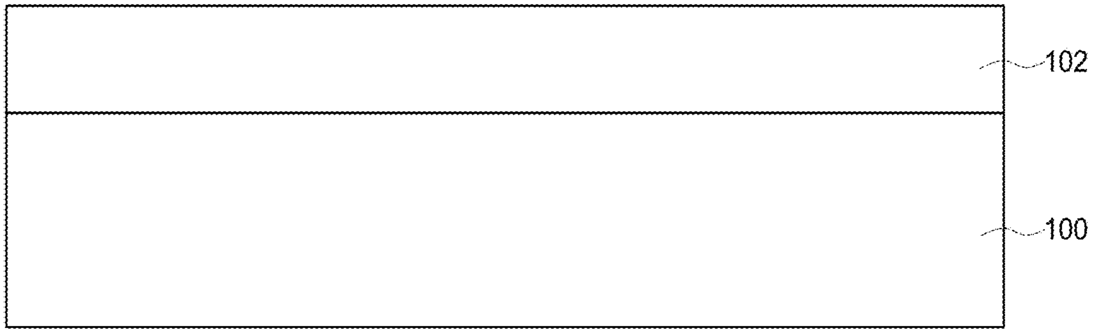
FIGS. 1A-1K show schematic sectional views of a method for producing a semiconductor device in accordance with an embodiment of the present disclosure.

The following embodiments will be described with accompany drawings to disclose the concept of the present disclosure. In the drawings or description, same or similar portions are indicated with same or similar numerals. Furthermore, a shape or a size of a member in the drawings may be enlarged or reduced. Particularly, it should be noted that a member which is not illustrated or described in drawings or description may be in a form that is known by a person skilled in the art. If not otherwise specified, a description similar to "a first layer/structure is on or under a second layer/structure" can include an embodiment in which the first layer/structure directly (or physically) contacts the second layer/structure, and can also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

The semiconductor device of the present disclosure is a light-emitting device (such as a light-emitting diode or a laser diode like a photonic crystal surface emitting laser (PCSEL), a light absorbing device (such as a photo-detector or a solar cell) or a non-optoelectronic device.

Analysis of the composition and/or dopant contained in each layer of the semiconductor device of the present disclosure may be conducted by any suitable method such as a secondary ion mass spectrometer (SIMS). A thickness of each layer may be obtained by any suitable method, such as a transmission electron microscopy (TEM) or a scanning electron microscope (SEM).

FIGS. 1A-1K show schematic sectional views of a method for producing a semiconductor device in accordance with an embodiment of the present disclosure. As shown in FIG. 1, first, a substrate 100 is provided. A first semiconductor layer 102 is formed on the substrate 100. The substrate 100 contains conductive or insulating material.

The conductive material includes gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The insulating material includes sapphire or the like. In an embodiment, the substrate 100 is a growth substrate. In some embodiments, the substrate 100 is a bonding substrate instead of a growth substrate, and the substrate 100 can be bonded to the first semiconductor layer 102 via a bonding structure (not shown).

The first semiconductor layer 102 may include a group III-V semiconductor material. The semiconductor material may contain elements, such as Al, Ga, As, P, N or In. For example, the semiconductor material includes an arsenide compound or a phosphide compound. In an embodiment, the first semiconductor layer 102 does not contain N. In an embodiment, the first semiconductor layer 102 includes a binary, ternary or quaternary group III-V compound semiconductor (such as GaAs, GaP, InP, InGaAs, AlGaAs, AlGaInP, InGaP or GaN).

Figure 1B:
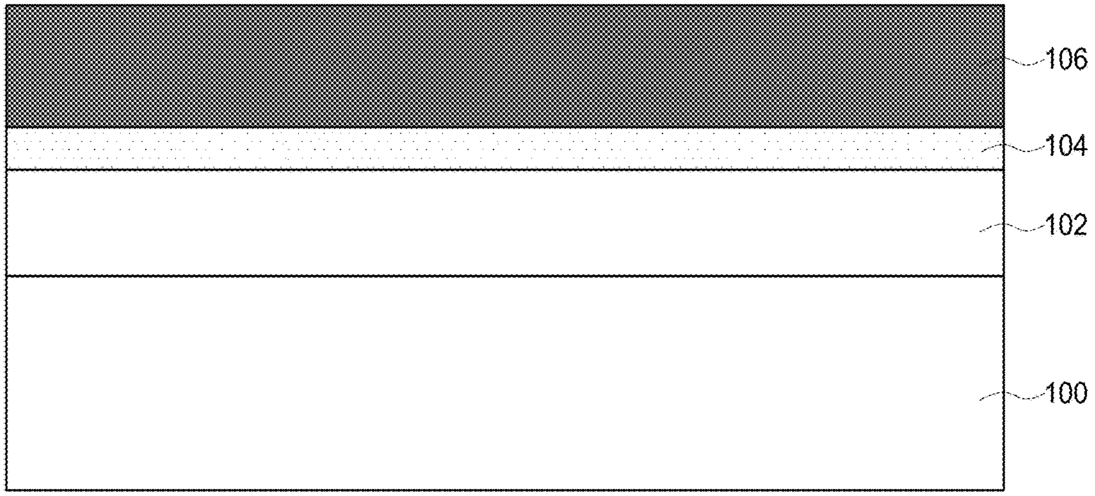

Next, as shown in FIG. 1B, a mask layer 104 is formed on the first semiconductor layer 102, and a photoresist layer 106 is formed on the mask layer 104. The material of the mask layer 104 may have a refractive index between 1 and 3. In an embodiment, the mask layer 104 includes an oxide (such as $TiO_2$, $Al_2O_3$ or $SiO_2$), a nitride (such as $SiN_x$) or a fluoride (such as $MgF_2$). The material of the photoresist layer 106 may include an oxide (such as $SiO_x$), an organic polymer (such as polymethyl methacrylate (PMMA)), or a photo-hardening resin (such as UV glue).

Figure 1C:
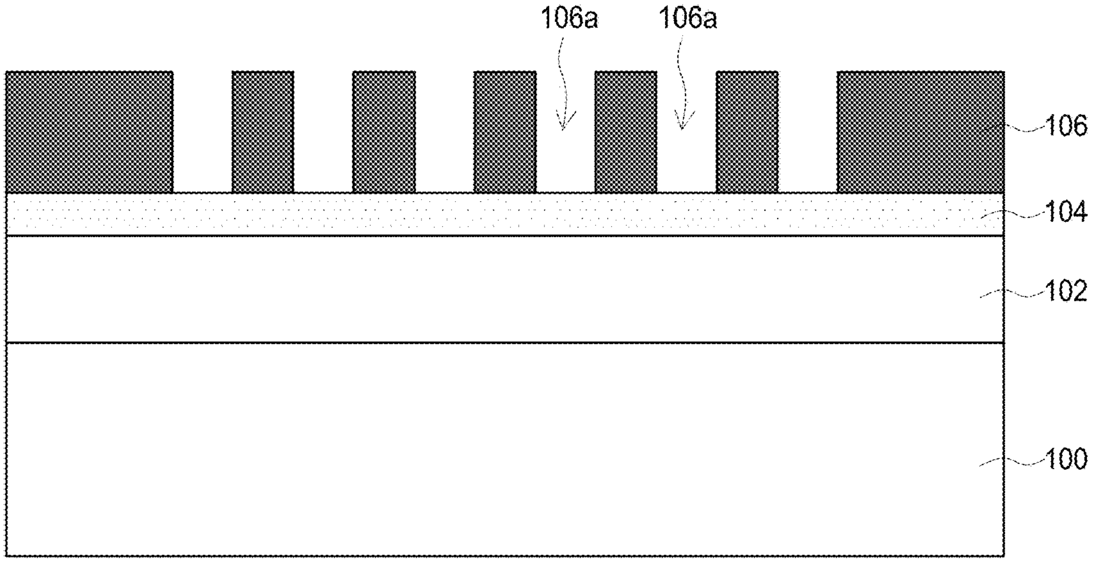

As shown in FIG. 1C, a plurality of recesses 106*a* is formed in the photoresist layer 106. The recesses 106*a* may define a pattern. The method of forming the plurality of recesses 106*a* is, for example, to provide a master mold (not shown) with a structure complementary to the pattern first, and then transfer the pattern to the photoresist layer 106 by nanoimprinting to form the plurality of recesses 106*a*. The material of the master mold may include a semiconductor material (such as silicon (Si), gallium arsenide (GaAs), or indium phosphide (InP)) or an organic polymer (such as polydimethylsiloxane (PDMS)).

Figure 1D:
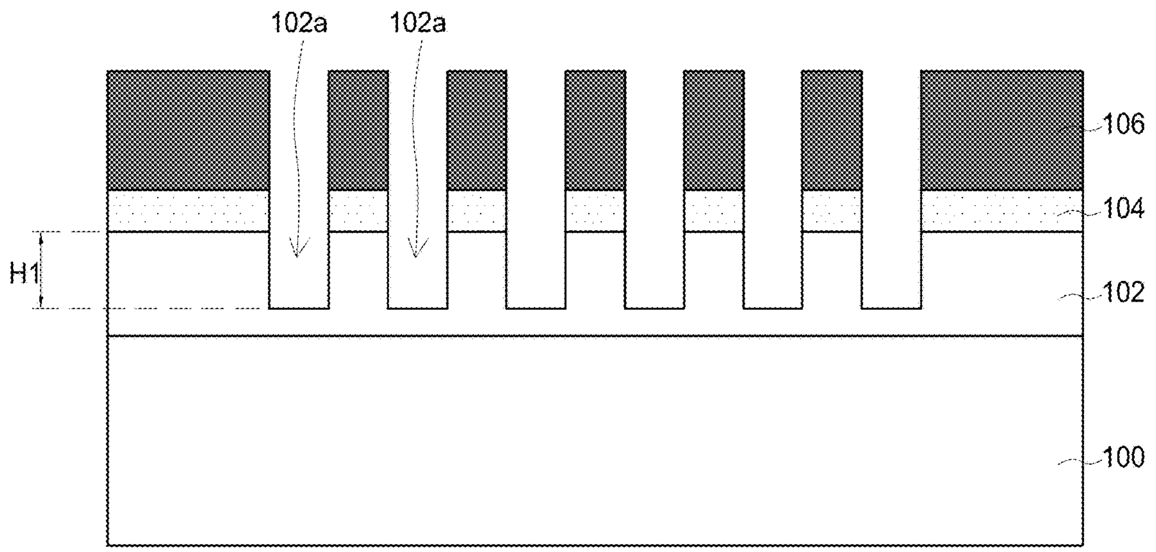

As shown in FIG. 1D, a portion of the mask layer 104 and a portion of the first semiconductor layer 102 are removed, thereby forming a plurality of first holes 102*a* in the first semiconductor layer 102. In an embodiment, a portion of the mask layer 104 and a portion of the first semiconductor layer 102 may be removed by wet etching or dry etching (such as an inductively coupled plasma (ICP) etching). Through this step, the pattern defined by the plurality of recesses 106*a* can be transferred to the first semiconductor layer 102. The plurality of first holes 102*a* may be arranged periodically. Each of the first holes 102*a* has an opening. Each of the first holes 102*a* may have a first height H1. In an embodiment, the first height H1 may be in the range of 10 nm to 10 μm. The removed portions of the mask layer 104 and the removed portion of the first semiconductor layer 102 are overlapped with the recesses 106*a* (see FIG. 1C) in the vertical direction.

According to another embodiment, a metal layer (not shown) can be formed to cover an upper surface of the mask layer 104, and then the photoresist layer 106 is formed on the metal layer. Next, a plurality of first holes 102*a* may be formed by removing a portion of the metal layer, a portion of the mask layer 104, and a portion of the first semiconductor layer 102. In some embodiments, by forming a metal layer on the mask layer 104 first and then performing the removal process (such as wet etching or dry etching), the etching selectivity can be improved in the removal process, that is helpful for further improving process operability. According to an embodiment, the material of the metal layer may include chromium (Cr).

Figure 1E:
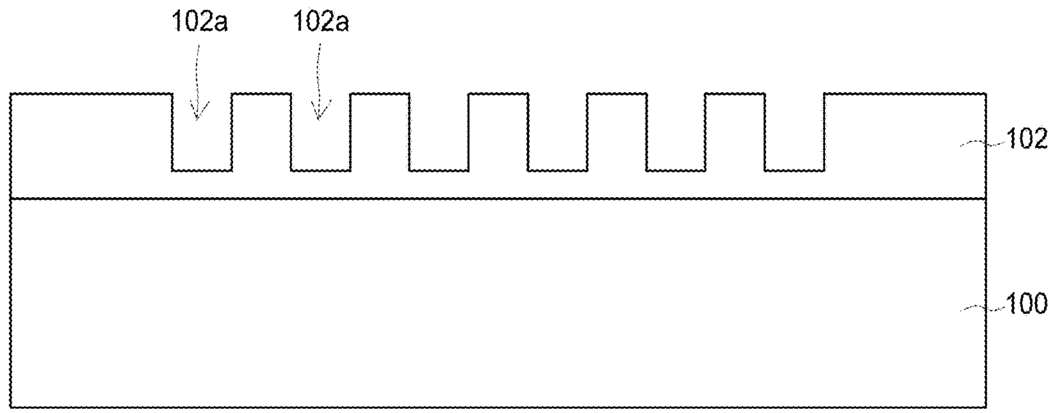
Figure 1F:
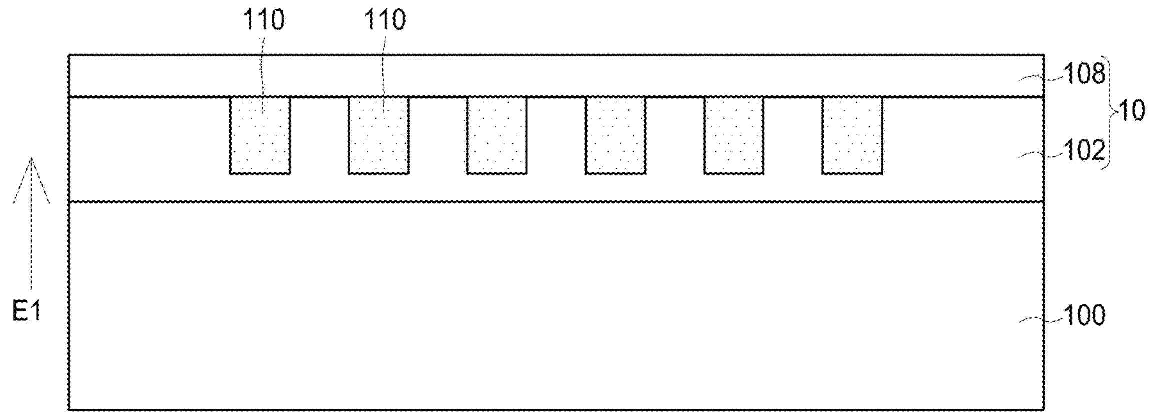

Referring to FIGS. 1E and 1F, the remaining mask layer 104 and photoresist layer 106 are then removed, and a second semiconductor layer 108 is formed on the first semiconductor layer 102 having the plurality of first holes 102*a*. Specifically, an epitaxial regrowth process may be performed on the first semiconductor layer 102 to form the second semiconductor layer 108. The first semiconductor layer 102 and the second semiconductor layer 108 may be defined as a first semiconductor structure 10. In FIG. 1F, the epitaxial growth direction of the first semiconductor structure 10 is indicated by an arrow E1. In an embodiment, the second semiconductor layer 108 covers the plurality of first holes 102*a* and does not fill in the holes 102*a*, and the second semiconductor layer 108 closes the openings of the first holes 102*a*. That is, the plurality of first holes 102*a* can be embedded and enclosed in the first semiconductor structure 10. In an embodiment, a portion of the second semiconductor layer 108 may fill the hole 102*a* and does not completely fill up the hole 102*a*. According to some embodiments, each of the first holes 102*a* may be filled with a dielectric material to form a plurality of first dielectric structures 110. The first dielectric structure 110 and the first semiconductor structure 10 can be defined as a first photonic crystal structure P1. The dielectric material may be gas or solid. That is, the first dielectric structure 110 may be gas or solid. The detailed descriptions of the second dielectric structure 110 can be referred to the following embodiments (see FIGS. 5A to 5G and corresponding paragraphs).

The second semiconductor layer 108 and the first semiconductor layer 102 may contain the same or different materials. Specifically, the second semiconductor layer 108 may include a group III-V semiconductor material. The semiconductor material may contain elements, such as Al, Ga, As, P, N or In. For example, the semiconductor material includes an arsenide compound or a phosphide compound. In an embodiment, the second semiconductor layer 108 includes a binary group III-V compound semiconductor (such as GaAs, GaP, or GaN). In an embodiment, the second semiconductor layer 108 does not include N. In an embodiment, when the second semiconductor layer 108 and the first semiconductor layer 102 have the same material, an interface between the second semiconductor layer 108 and the first semiconductor layer 102 may not be obvious under SEM or TEM analysis, that is, the second semiconductor layer 108 and the first semiconductor layer 102 may be considered as a single layer.

Figure 1G:
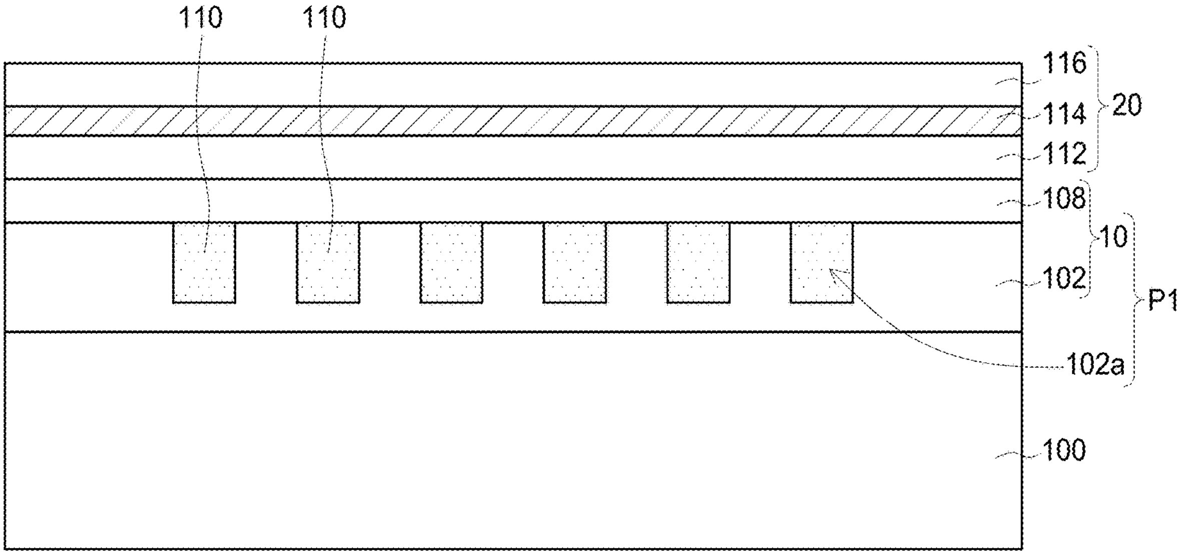

Then, as shown in FIG. 1G, a second semiconductor structure 20 is formed on the second semiconductor layer 108. In this embodiment, the second semiconductor structure 20 includes a third semiconductor layer 112, a fourth semiconductor layer 116 on the third semiconductor layer 112, and an active region 114. The active region 114 is located between the third semiconductor layer 112 and the fourth semiconductor layer 116. According to an embodiment, the material of the third semiconductor layer 112 and the fourth semiconductor layer 116 may include a binary, ternary or quaternary group III-V semiconductor material, such as InP, GaAs, InGaAs, InAlAs or InGaAsP. The third semiconductor layer 112 and the fourth semiconductor layer 116 may have the same or different thicknesses. In an embodiment, the third semiconductor layer 112 and the fourth semiconductor layer 116 may have or may not have a dopant. The third semiconductor layer 112 and the fourth semiconductor layer 116 may serve as confinement layers for confining carriers in the active region 114.

The active region 114 may include a plurality of well layers and a plurality of barrier layers that are alternately stacked. The material of the active region 114 may include a ternary or quaternary group III-V semiconductor material, such as InP, GaAs, InGaAs, InAlAs, or InGaAsP. Specifically, the barrier layers in the active region 114, the third semiconductor layer 112 and the fourth semiconductor layer 116 may include the same material. In some embodiments, the active region 114 may emit or absorb a radiation during operation of the semiconductor device. The radiation may be non-coherent or coherent light, and may be visible or invisible light. Specifically, the radiation may have a peak wavelength between 400 nm and 2000 nm, such as 405 nm, 532 nm, 615 nm, 660 nm, 730 nm, 810 nm, 850 nm, 910 nm, 940 nm, 1050 nm, 1070 nm, 1100 nm, 1200 nm, 1300 nm, 1400 nm, 1450 nm, 1550 nm, 1600 nm, 1650 nm, or 1700 nm.

Figure 1H:
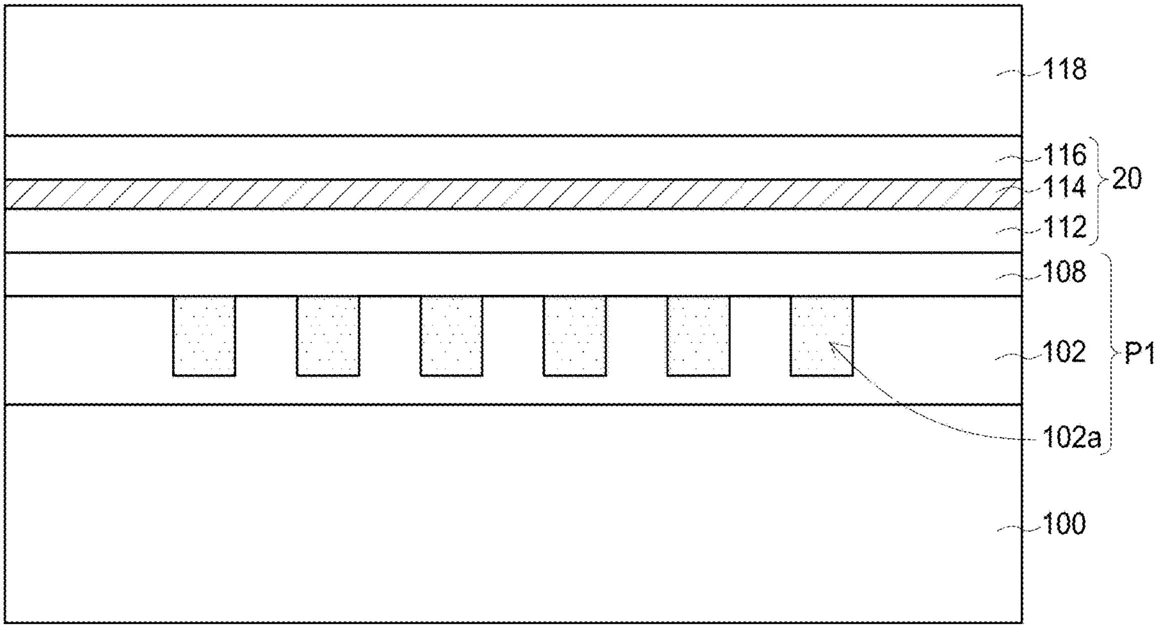

Next, as shown in FIG. 1H, a fifth semiconductor layer 118 is formed on the second semiconductor structure 20. The fifth semiconductor layer 118 may include a group III-V semiconductor material. The group III-V semiconductor material may include elements, such as Al, Ga, As, P, N or In. For example, the group III-V semiconductor material includes an arsenide compound or a phosphide compound. In an embodiment, the fifth semiconductor layer 118 does not include N. In an embodiment, the fifth semiconductor layer 118 includes a binary, ternary or quaternary group III-V compound semiconductor (such as GaAs, GaP, InP, InGaAs, AlGaAs, AlGaInP, InGaP or GaN). In an embodiment, the fifth semiconductor layer 118 and the first semiconductor layer 102 may include the same material.

Figure 1I:
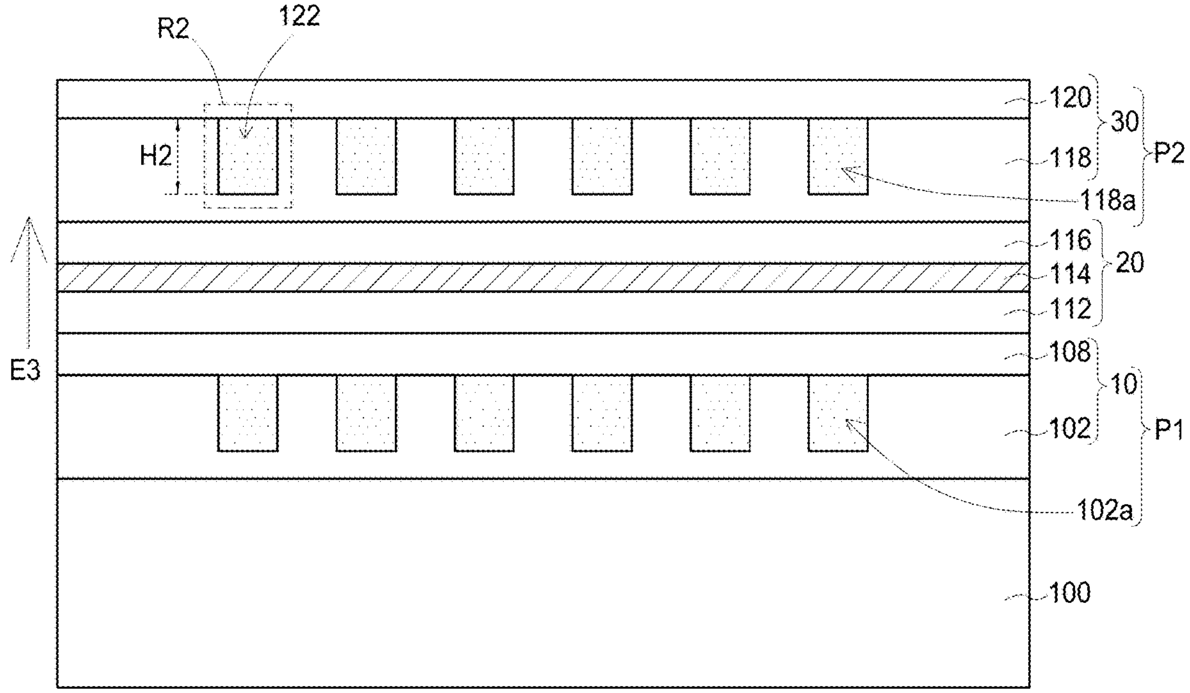

Then, the steps shown in FIGS. 1B to 1F can be repeatedly performed to form a plurality of second holes 118*a* in the fifth semiconductor layer 118, and a sixth semiconductor layer 120 is formed on the fifth semiconductor layer 118, thereby forming a structure as shown in FIG. 1I. Specifically, in this step, the sixth semiconductor layer 120 may be formed through an epitaxial regrowth process on the fifth semiconductor layer 118. The plurality of second holes 118*a* may be arranged periodically. Each of the second holes 118*a* may have a second height H2. In an embodiment, the second height H2 may be in the range of 30 nm to 10 μm. The first height H1 and the second height H2 may be the same or different. The fifth semiconductor layer 118 and the sixth semiconductor layer 120 may be defined as the third semiconductor structure 30. In FIG. 1I, the epitaxial growth direction of the third semiconductor structure 30 is indicated by an arrow E3. In this embodiment, the sixth semiconductor layer 120 covers the plurality of second holes 118*a* and does not fill the holes 118*a*, and the sixth semiconductor layer 120 closes the openings of the second holes 118*a*. That is, the plurality of second holes 118 a may be embedded and enclosed in the third semiconductor structure 30. In an embodiment, a portion of the sixth semiconductor layer 120 may fill the hole 118*a* and does not completely fill up the hole 118*a*. Each of the second holes 118*a* may be filled with a dielectric material to form a plurality of second dielectric structures 122. The second dielectric structure 122 and the third semiconductor structure 30 can be defined as a second photonic crystal structure P2. The detailed descriptions of the second dielectric structure 122 can be referred to the following embodiments (see FIGS. 5A to 5G and corresponding paragraphs).

The sixth semiconductor layer 120 and the fifth semiconductor layer 118 may include the same or different materials. Specifically, the sixth semiconductor layer 120 may include a group III-V semiconductor material. The semiconductor material may contain elements, such as Al, Ga, As, P, N or In. For example, the semiconductor material includes an arsenide compound or a phosphide compound. In an embodiment, the sixth semiconductor layer 120 includes a binary group III-V compound semiconductor (such as GaAs, GaP, or GaN). In an embodiment, the sixth semiconductor layer 120 does not include N. In an embodiment, when the sixth semiconductor layer 120 and the fifth semiconductor layer 118 have the same material, an interface between the sixth semiconductor layer 120 and the fifth semiconductor layer 118 may not be obvious under SEM or TEM analysis, that is, the sixth semiconductor layer 120 and the fifth semiconductor layer 118 may be considered as a single layer.

Figure 1J:
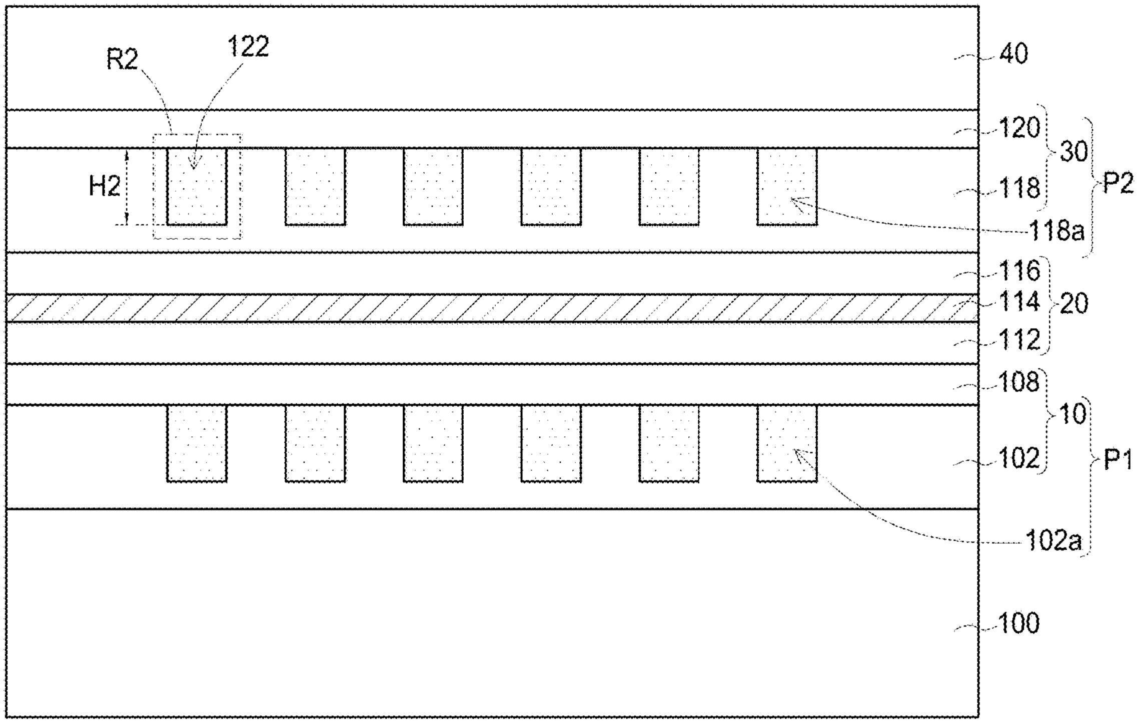
Figure 1K:
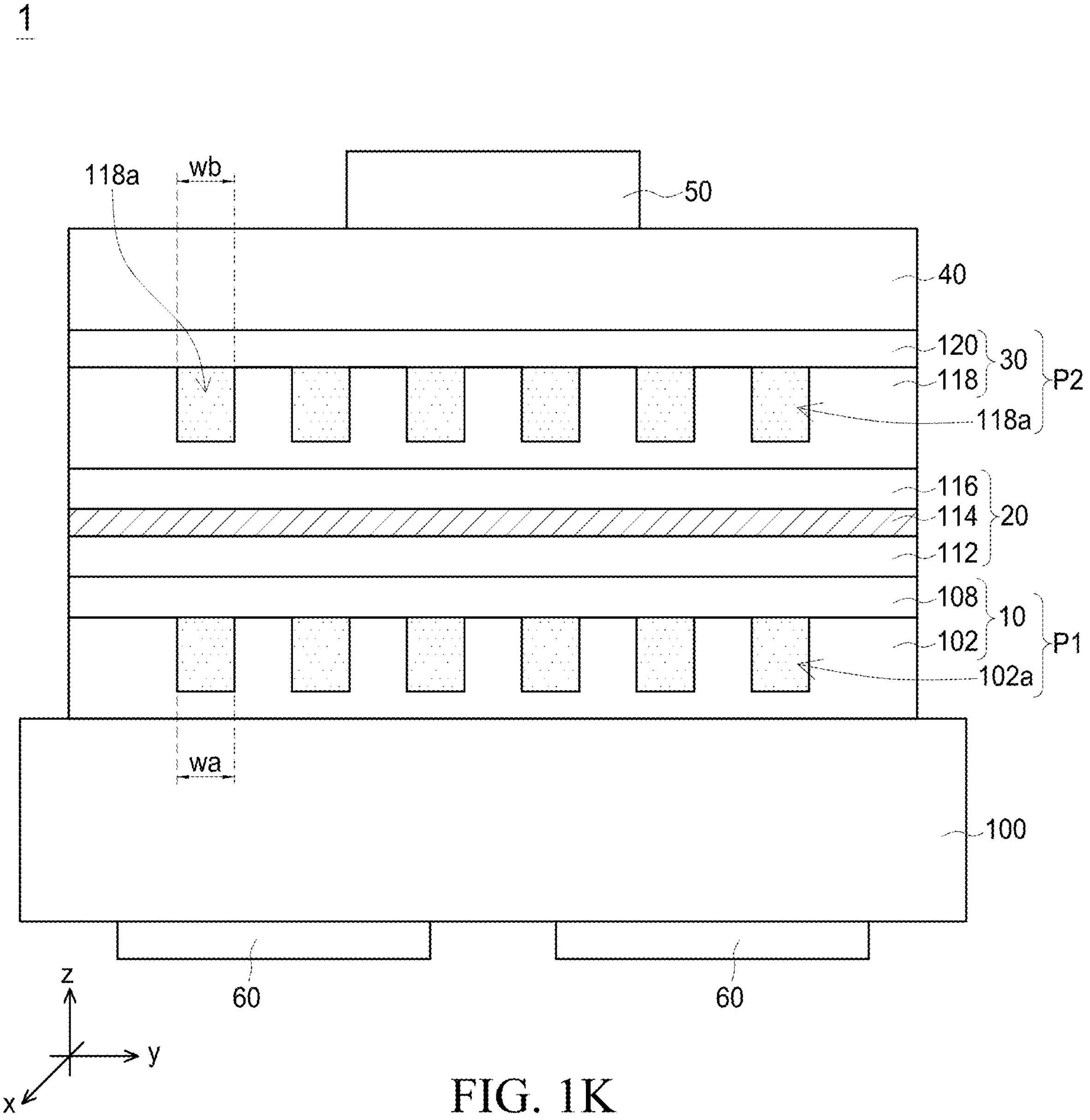

As shown in FIG. 1J, a fourth semiconductor structure 40 is formed on the third semiconductor structure 30. Finally, referring to FIG. 1K, the first electrode 50 is formed on the fourth semiconductor structure 40, and the second electrode 60 is formed under the substrate 100, thereby completing the semiconductor device 1. In some embodiments, before forming the first electrode 50 and the second electrode 60, a portion of the first semiconductor layer 102, a portion of the second semiconductor layer 108, a portion of the second semiconductor structure 20, a portion of the fifth semiconductor layer 118, a portion of the sixth semiconductor layer 120 and a portion of the fourth semiconductor structure 40 may be removed in a process for defining the size of the active region 114. Therefore, in FIG. 1K, widths of the first semiconductor layer 102, the second semiconductor layer 108, the second semiconductor structure 20, the fifth semiconductor layer 118, the sixth semiconductor layer 120 and the fourth semiconductor structure 40 are smaller than the width of the substrate 100. As shown in FIG. 1K, each of the first holes 102*a* may have a width wa, and each of the second holes 118*a* may have a width wb. The width wa and the width wb may be the same or different. In an embodiment, the width wa and the width wb may fall within the range of 100 nm to 2000 nm. In an embodiment, a distance between the well layer closest to the first hole 102*a* in the active region 114 and the first hole 102*a* is between 200 nm and 1 μm. In an embodiment, a distance between the well layer closest to the second hole 118*a* in the active region 114 and the second hole 118*a* is between 200 nm and 1 μm. In some embodiments, by controlling the distances between the well layer and the first hole 102*a* (and/or the second hole 118*a*) within the above-mentioned range(s), the light emitted from the active region 114 may be coupled in the photonic crystal structure so that the luminance characteristics of light may be easily manipulated.

The fourth semiconductor structure 40 may include a single layer or multiple layers. The material of the fourth semiconductor structure 40 may include a binary, ternary or quaternary group III-V semiconductor material, such as InP, GaAs, InGaAs, InAlAs or InGaAsP. In an embodiment, the fourth semiconductor structure 40 does not include N.

The first electrode 50 and the second electrode 60 can be used for electrical connection with an external power source (not shown) and the active region 114. The material of the first electrode 50 and the second electrode 60 may include a metal oxide, metal or an alloy. The metal oxide may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO) or indium zinc oxide (IZO). The metal may include germanium (Ge), beryllium (Be), zinc (Zn), gold (Au), platinum (Pt), titanium (Ti), aluminum (Al), or nickel (Ni), or copper (Cu). The alloy may include two or more metals selected from the above metals, such as germanium gold nickel (GeAuNi), beryllium gold (BeAu), germanium gold (GeAu), or zinc gold (ZnAu). The detailed configurations of the first electrodes 50 and the second electrodes 60 can be referred to the following embodiments (see FIGS. 4A to 4B and corresponding paragraphs).

Figure 2A:
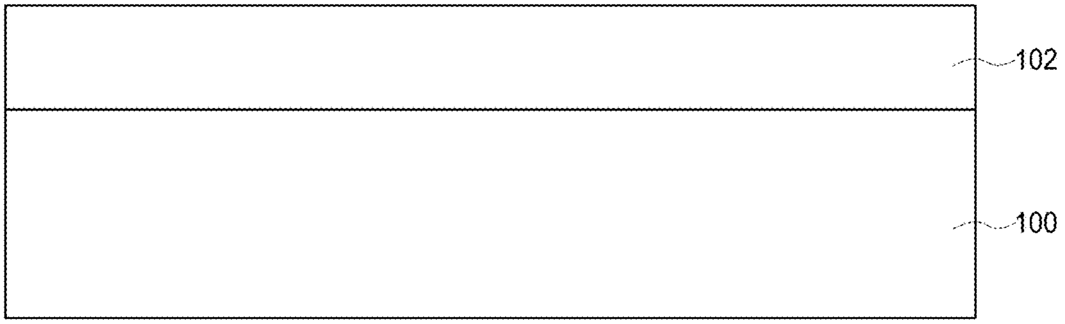
FIGS. 2A-2G show schematic sectional views of a method for producing a semiconductor device in accordance with another embodiment of the present disclosure.
Figure 2B:
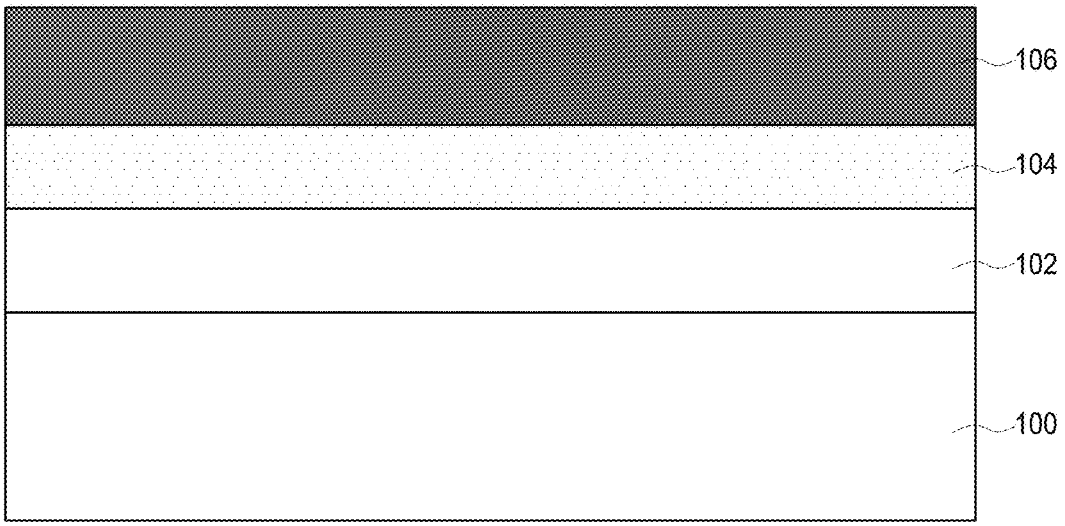

FIGS. 2A-2G show schematic sectional views of a method for producing a semiconductor device 1' in accordance with another embodiment of the present disclosure. As shown in FIG. 2A and FIG. 2B, in this embodiment, a substrate 100 is provided and a first semiconductor layer 102 is formed on the substrate 100. A mask layer 104 is formed on the first semiconductor layer 102 and a photoresist layer 106 is formed on the mask layer 104. In this embodiment, a thickness of the mask layer 104 is, for example, in a range of 30 nm to 10 μm.

Figure 2C:
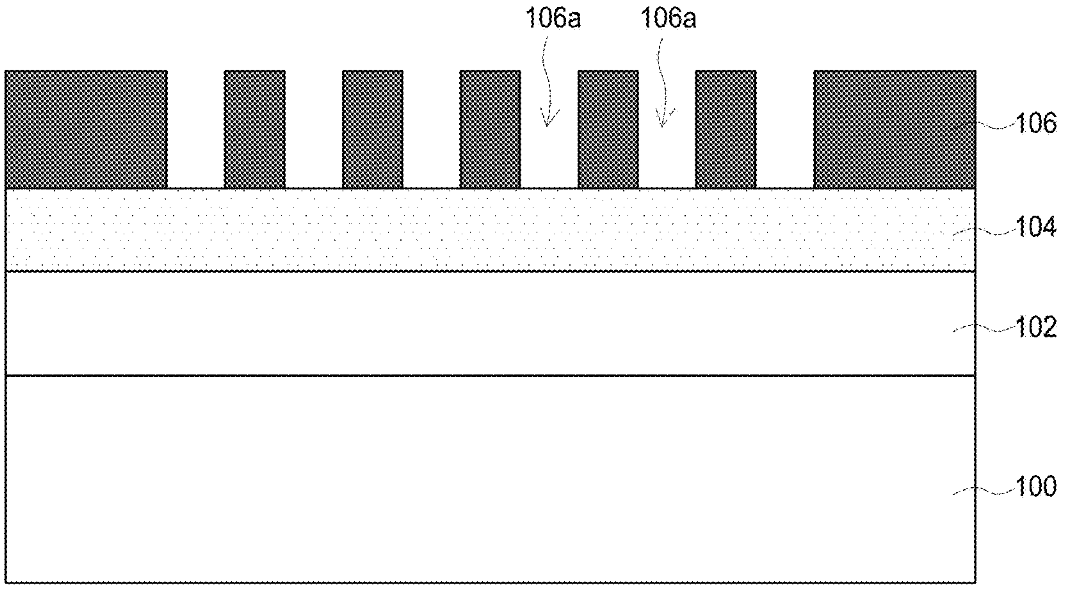
Figure 2D:
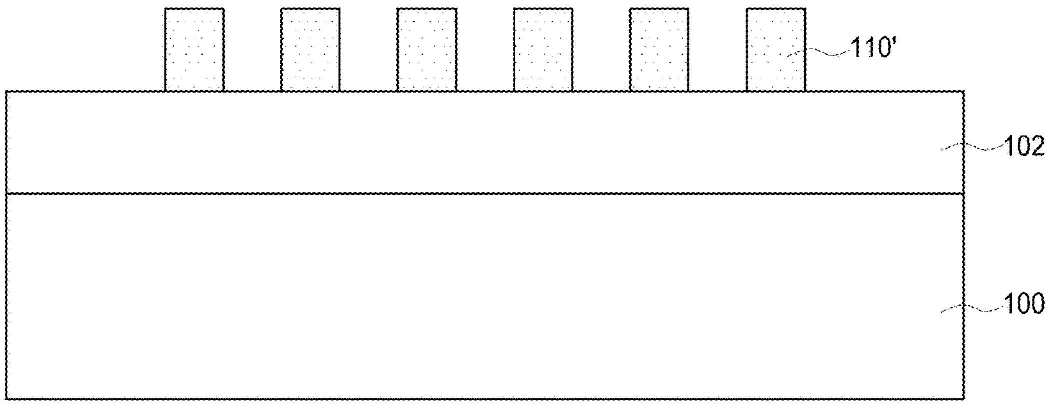

As shown in FIG. 2C, a plurality of recesses 106*a* is formed in the photoresist layer 106 to define a pattern. As shown in FIG. 2D, a portion of the mask layer 104 is removed corresponding to the pattern of the photoresist layer 106, and then the photoresist layer 106 is removed, thereby forming a plurality of first dielectric structures 110' on the first semiconductor layer 102. That is, in this embodiment, the mask layer 104 is processed to form the plurality of first dielectric structures 110' and the first semiconductor layer 102 is not removed.

Figure 2E:
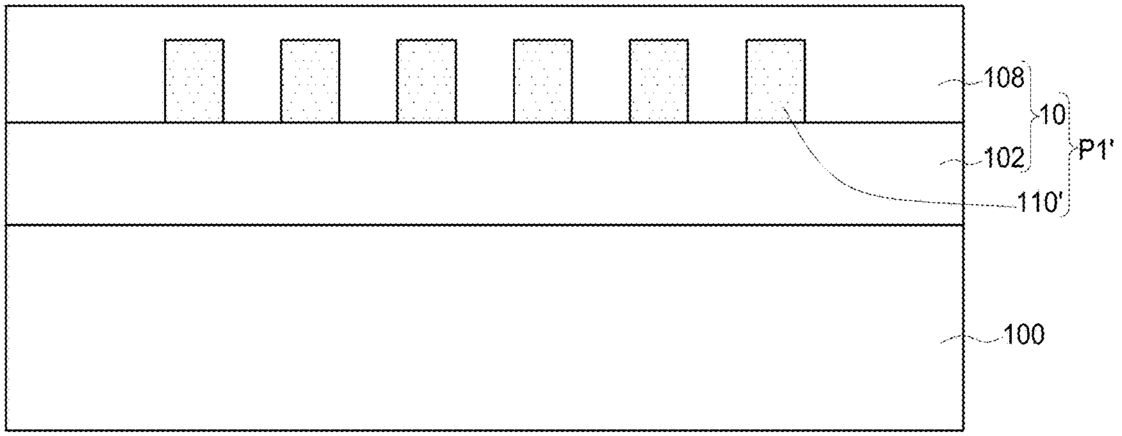

As shown in FIG. 2E, an epitaxial regrowth process may be performed on the plurality of first dielectric structures 110' to form the second semiconductor layer 108. Likewise, the first semiconductor layer 102 and the second semiconductor layer 108 can be defined as the first semiconductor structure 10. Specifically, the second semiconductor layer 108 covers an upper surface and a side surface of each of the first dielectric structures 110'. In this embodiment, a plurality of first dielectric structures 110' is embedded and enclosed in the first semiconductor structure 10. The plurality of first dielectric structures 110' and the first semiconductor structures 10 can be defined as a first photonic crystal structure P1'.

Figure 2F:
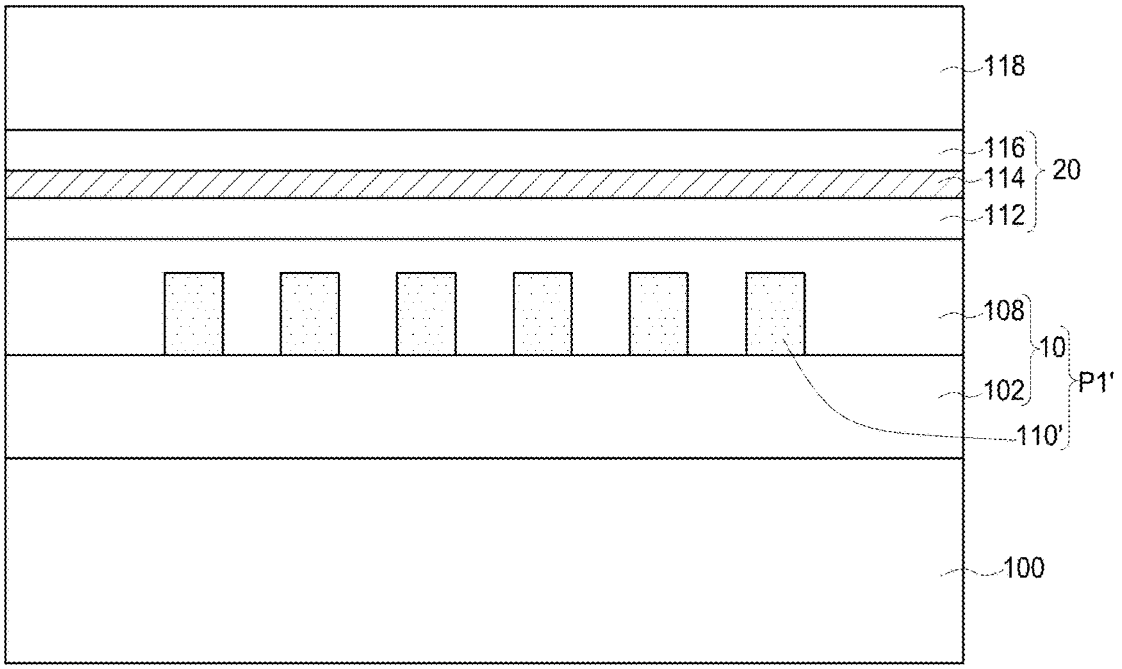

As shown in FIG. 2F, a second semiconductor structure 20 including a third semiconductor layer 112, an active region 114 and a fourth semiconductor layer 116 is formed on the second semiconductor layer 108, and then a fifth semiconductor layer 118 is formed on the second semiconductor structure 20. Then, the steps described in the paragraphs corresponding to FIGS. 2B to 2E can be repeated. Specifically, a mask layer (not shown) is formed on the fifth semiconductor layer 118, then a portion of the mask layer is removed to form a plurality of second dielectric structures 122', and an epitaxial regrowth process is performed on the plurality of second dielectric structures 122' to form a sixth semiconductor layer 120. Likewise, the fifth semiconductor layer 118 and the sixth semiconductor layer 120 can be defined as the third semiconductor structure 30. The plurality of second dielectric structures 122 are embedded and enclosed in the third semiconductor structure 30. The plurality of second dielectric structures 122' and the third semiconductor structures 30 can be defined as a second photonic crystal structure P2'.

Figure 2G:
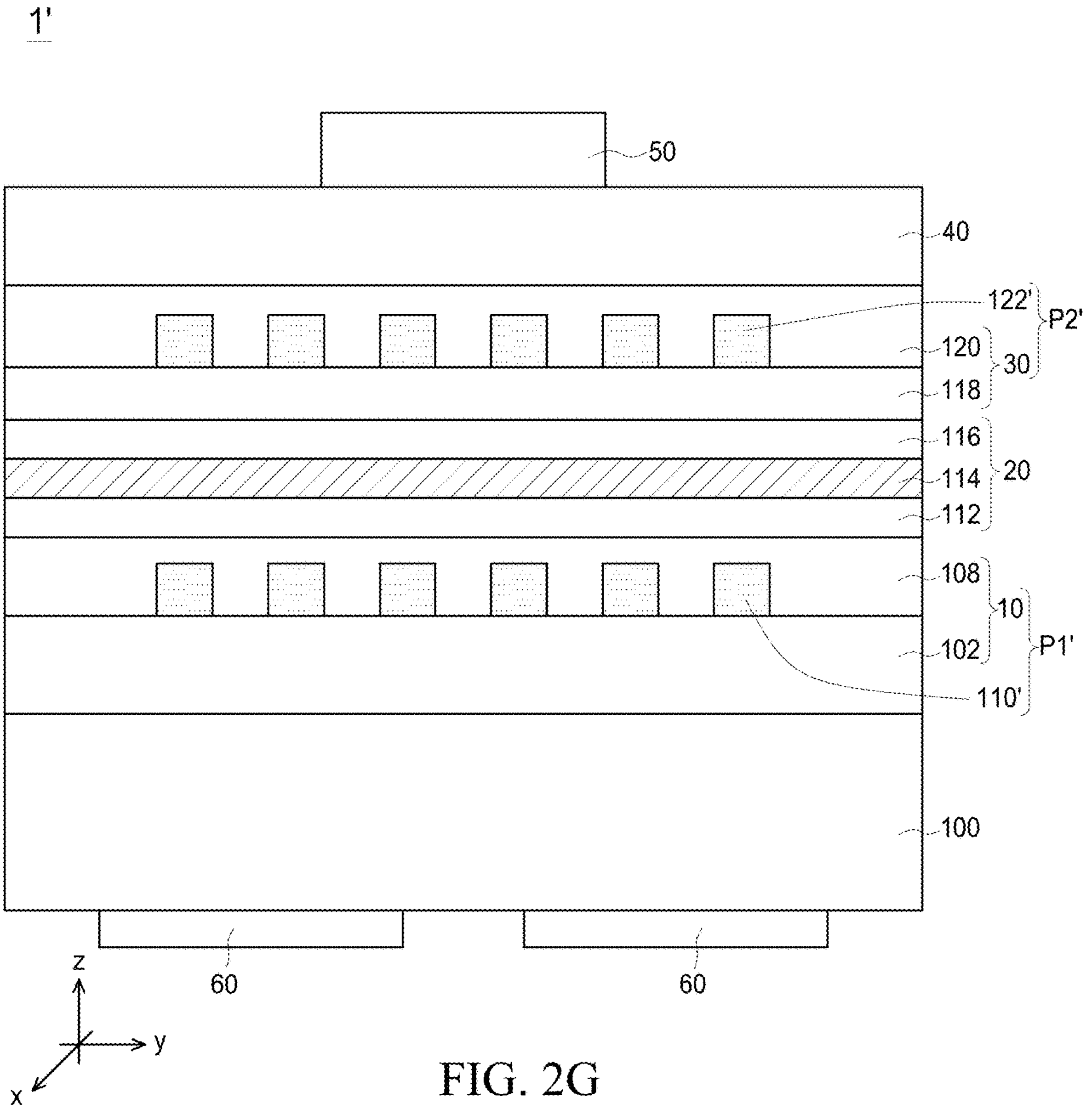

Finally, the fourth semiconductor structure 40 is formed on the third semiconductor structure 30, the first electrode 50 is formed on the fourth semiconductor structure 40, and the second electrode 60 is formed under the substrate 100, thereby completing the semiconductor device 1' as shown in FIG. 2G. In this embodiment, the photoresist pattern is transferred to the mask layer 104 by wet etching or dry etching, a portion of the mask layer 104 is removed, the remaining portion is processed to form the first dielectric structure 110' and/or the second dielectric structure 122', and then an epitaxial regrowth process is performed, so that the steps of forming a plurality of holes and filling the dielectric material into the plurality of holes can be omitted. Therefore, the manufacturing process can be further simplified.

In this embodiment, the first dielectric structure 110' and the second dielectric structure 122' are solid, and the related detailed description can refer to the following embodiments (see FIG. 5B to FIG. 5G and the corresponding paragraphs). The detailed descriptions of positions, relative relationships and material of other layers or structures as well as structural variations in this embodiment can be referred to the foregoing embodiments and are not repeatedly described herein.

Figure 3A:
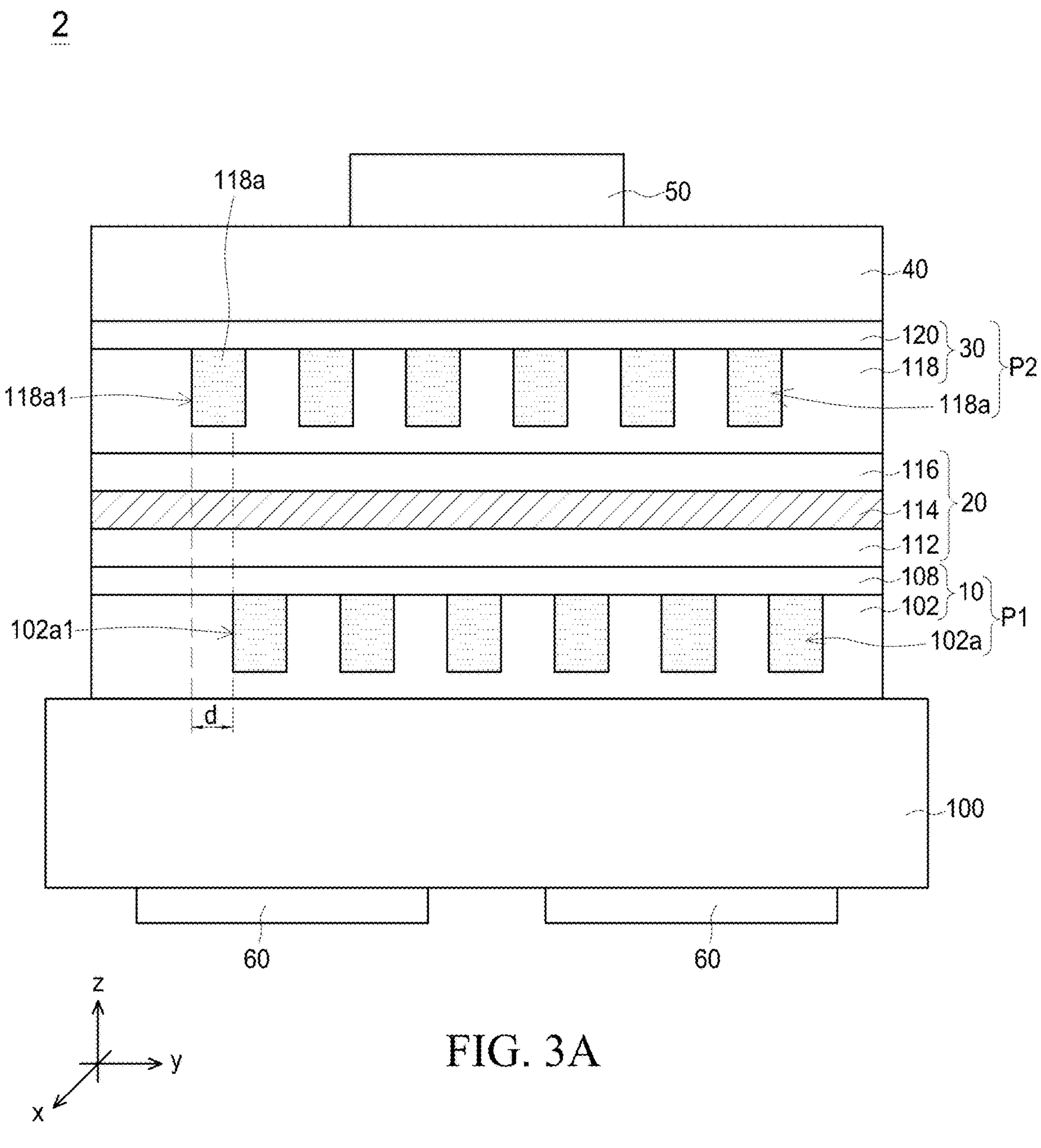
FIG. 3A shows a schematic sectional view of a semiconductor device in accordance with an embodiment of the present disclosure.

FIG. 3A shows a schematic sectional view of a semiconductor device 2 in accordance with an embodiment of the present disclosure. The semiconductor device 2 has a similar structure to the semiconductor device 1, and the main difference is that in the semiconductor device 1, the plurality of first holes 102*a* in the first photonic crystal structure P1 and the plurality of second holes 118*a* in the second photonic crystal structure P2 are completely overlapped in a vertical direction (i.e., the direction parallel to the epitaxial growth direction of the first semiconductor structure 10 or the third semiconductor structure 30), but in the semiconductor device 2, the plurality of first holes 102*a* in the first photonic crystal structure P1 and the plurality of second holes 118*a* in the second photonic crystal structure P2 are not completely overlapped in the vertical direction. As shown in FIG. 3A, when vertically projecting a side wall 102*a*1 of the first hole 102*a* which is closest to an edge of the semiconductor device 2 and a side wall 118*a*1 of the second hole 118*a* which is closest to the same edge of the semiconductor device 2 on a surface of the substrate 100, they are separated by a distance d. The detailed descriptions of positions, relative relationships and material of other layers or structures as well as structural variations in this embodiment can be referred to the foregoing embodiments and are not repeatedly described herein.

As described in the foregoing embodiments, the plurality of first holes 102*a* in the first photonic crystal structure P1 and the plurality of second holes 118*a* in the second photonic crystal structure P2 may be completely overlapped (as shown in FIG. 1K), partially overlapped and partially not overlapped (as shown in FIG. 3A), or completely not overlapped (not shown) in the vertical direction. Similarly, in the semiconductor device 1' shown in FIG. 2G, although the plurality of first dielectric structures 110' in the first photonic crystal structure P1' and the plurality of second dielectric structures 122' in the second photonic crystal structure P2' are completely overlapped in the vertical direction, in other embodiments the plurality of first dielectric structures 110' and the plurality of second dielectric structures 122' may be partially overlapped and partially not overlapped, or completely not overlapped (not shown) in the vertical direction.

Figure 3B:
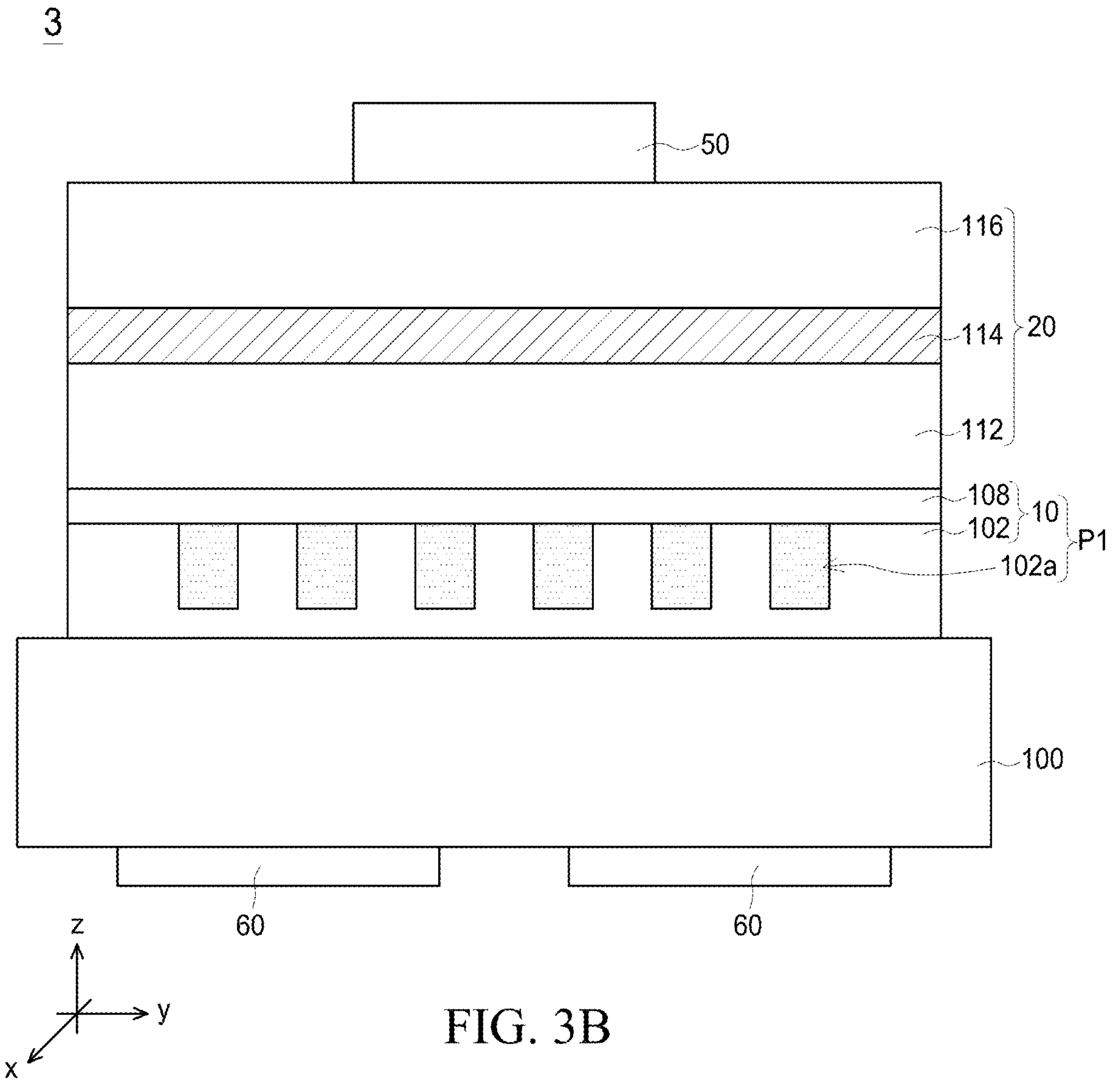
FIG. 3B shows a schematic sectional view of a semiconductor device in accordance with an embodiment of the present disclosure.

FIG. 3B shows a schematic sectional view of a semiconductor device 3 in accordance with an embodiment of the present disclosure. The main difference between the semiconductor device 3 and the semiconductor device 1 is that the semiconductor device 3 only includes the first photonic crystal structure P1 and is devoid of the second photonic crystal structure P2. That is, there is only one photonic crystal structure in the semiconductor device 3. Specifically, the first photonic crystal structure P1 is located between the substrate 100 and the second semiconductor structure 20 including the active region 114. Similarly, the semiconductor device 1' shown in FIG. 2G may only include the first photonic crystal structure P1' and be devoid of the second photonic crystal structure P2'. The detailed descriptions of positions, relative relationships and material of other layers or structures as well as structural variations in this embodiment can be referred to the foregoing embodiments and are not repeatedly described herein.

Figure 3C:
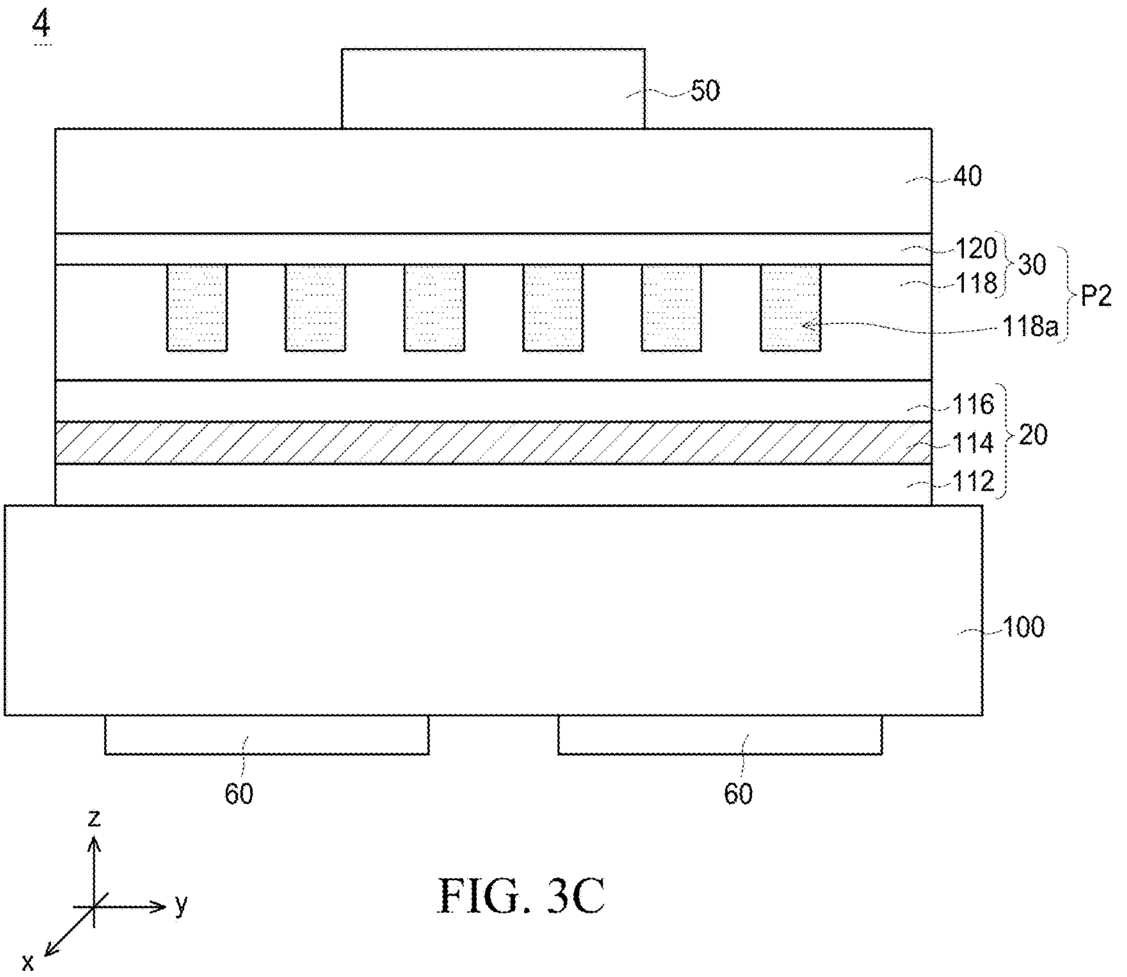
FIG. 3C shows a schematic sectional view of a semiconductor device in accordance with an embodiment of the present disclosure.

FIG. 3C shows a schematic sectional view of a semiconductor device 4 in accordance with an embodiment of the present disclosure. The main difference between the semiconductor device 4 and the semiconductor device 1 is that the semiconductor device 4 only includes the second photonic crystal structure P2 and is devoid of the first photonic crystal structure P1. The second semiconductor structure 20 including the active region 114 is located between the substrate 100 and the second photonic crystal structure P2, and the second photonic crystal structure P2 is located between the second semiconductor structure 20 and the fourth semiconductor structure 40. Similarly, the semiconductor device 1' shown in FIG. 2G may only include the second photonic crystal structure P2' and be devoid of the first photonic crystal structure P1'. The detailed descriptions of positions, relative relationships and material of other layers or structures as well as structural variations in this embodiment can be referred to the foregoing embodiments and are not repeatedly described herein.

Figure 4A:
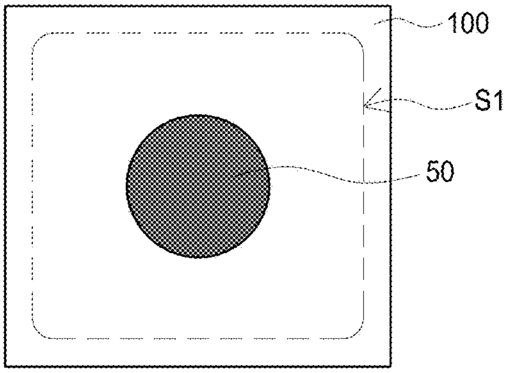
FIG. 4A shows a schematic top view of a semiconductor device in accordance with an embodiment of the present disclosure.
Figure 4B:
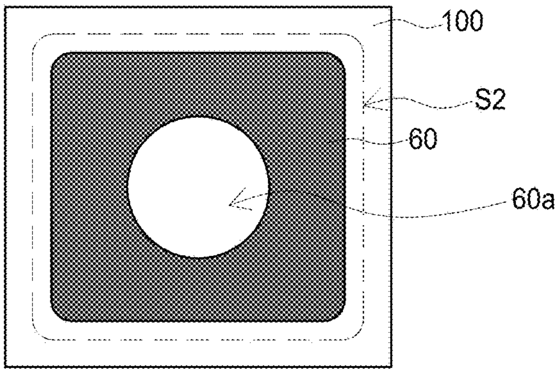
FIG. 4B shows a schematic bottom view of a semiconductor device in accordance with an embodiment of the present disclosure.

FIG. 4A shows a schematic top view of a semiconductor device in accordance with an embodiment of the present disclosure. FIG. 4B shows a schematic bottom view of a semiconductor device in accordance with an embodiment of the present disclosure. Specifically, FIG. 4A may represent a schematic top view of the semiconductor device 1, semiconductor device 1', the semiconductor device 2, the semiconductor device 3 or the semiconductor device 4, and FIG. 4B may represent a schematic bottom view of the semiconductor device 1, the semiconductor device 1', the semiconductor device 2, the semiconductor device 3 or the semiconductor device 4. In FIGS. 4A and 4B, the dotted line S1 represents the projection of the first semiconductor structure 10, the second semiconductor structure 20, the third semiconductor structure 30 and/or the fourth semiconductor structure 40 to an upper surface of the substrate 100 in the vertical direction in the semiconductor device. The dotted line S2 represents the projection of the first semiconductor structure 10, the second semiconductor structure 20, the third semiconductor structure 30 and/or the fourth semiconductor structure 40 to a lower surface of the substrate 100 in the vertical direction in the semiconductor device. Viewed from above, the shape of the first electrode 50 may be a polygon (such as a rectangle or a triangle), a circle or an ellipse. As shown in FIG. 4A, in this embodiment, the shape of the first electrode 50 is approximately a circle. In the present embodiment, the second electrode 60 and the first electrode 50 do not overlap in the vertical direction, so that during operation of the semiconductor device, the current distribution in the device can be more uniform. As shown in FIG. 4B, the shape of the second electrode 60 can be a rectangle with rounded corners, and have a circular hollow portion 60*a*. The profile of the second electrode 60 is surrounded by the dotted line S2, which means that the projected area of the second electrode 60 to the lower surface of the substrate 100 in the vertical direction is smaller than the projected area(s) of the first semiconductor structure 10, the second semiconductor structure 20, the third semiconductor structure 30 and/or the four semiconductor structures 40 to the lower surface of the substrate 100 in the vertical direction. In an embodiment, a width of the hollow portion 60*a* of the second electrode 60 is larger than the width of the first electrode 50 for ensuring that positions of the first electrode 50 and the second electrode 60 are separated by a distance, thereby avoiding local current crowding resulting from overlapping of the first electrode 50 and the second electrode 60 in the vertical direction, so that current spreading in the semiconductor device can be further improved. The detailed descriptions of positions, relative relationships and material of other layers or structures as well as structural variations in this embodiment can be referred to the foregoing embodiments and are not repeatedly described herein.

FIGS. 5A-5G respectively shows a schematic sectional view of a hole in a semiconductor device in accordance with an embodiment of the present disclosure. FIGS. 5A to 5G show several configurations for the first dielectric structures 110 which is formed by filling the plurality of first holes 102*a* with a dielectric material, and it should be noted that the structures shown in FIGS. 5A to 5G are also applicable to the plurality of second dielectric structures 122 which is formed by filling the plurality of second holes 118*a* with a dielectric material. For ease of understanding, in FIGS. 5A to 5G the first dielectric structure 110 is illustrated as an example, so the semiconductor layer surrounding the first hole 102*a* is marked as the first semiconductor layer 102 and the semiconductor layer on the first hole 102*a* is marked as the second semiconductor layer 108. Specifically, the dielectric material can be a gas or a solid. In some embodiments, each of the first dielectric structures 110 and/or the second dielectric structures 122 have the same configuration. In some embodiments, the plurality of first dielectric structures 110 and/or the plurality of second dielectric structures 122 may have two, three, or more configurations. The structures shown in FIGS. 5D to 5G may also be applied to the plurality of first dielectric structures 110' and/or the plurality of second dielectric structures 122' that are formed from a mask layer containing a dielectric material. Similarly, the plurality of first dielectric structures 110' and/or the plurality of second dielectric structures 122' may all have the same configuration, or may have two, three, or more configurations.

In some embodiments, there may be a first refractive index difference between the first semiconductor layer 102 and the first dielectric structure 110. The first refractive index difference may be in the range of greater than 0 to 3 or less. In some embodiments, when the first dielectric structure 110 includes two or more kinds of dielectric materials, the first refractive index difference can be calculated based on an equivalent refractive index of the first dielectric structure 110. Regarding the calculation of the equivalent refractive index, the refractive index of each dielectric material in the first dielectric structure 110 can be multiplied by the respective volume ratios (%) of each dielectric material in the first dielectric structure 110. For example, when the first dielectric structure 110 includes a first dielectric material and a second dielectric material, the first dielectric material has a refractive index of 1.5 and occupies 40% of the total volume of the first dielectric structure 110, the second dielectric material has a refractive index of 2 and occupies 60% of the total volume of the first dielectric structure 110, then the equivalent refractive index of the first dielectric structure 110 is $1.5*40\%+2*60\%=0.6+1.2=1.8$. According to an embodiment, the first dielectric structure 110 may have a refractive index (or an equivalent refractive index) in a range from 1 to 3. Similarly, there may be a second refractive index difference between the fifth semiconductor layer 118 and the second dielectric structure 122. The second refractive index difference may be in the range of greater than 0 to 3 or less. According to an embodiment, when the second dielectric structure 122 includes two or more kinds of dielectric materials, the second refractive index difference can also be calculated based on an equivalent refractive index of the second dielectric structure 122. The second dielectric structure 122 may have a refractive index (or an equivalent refractive index) in a range from 1 to 3.

Figures 5A, 5B, 5C, 5D, 5E, 5F, 5G:
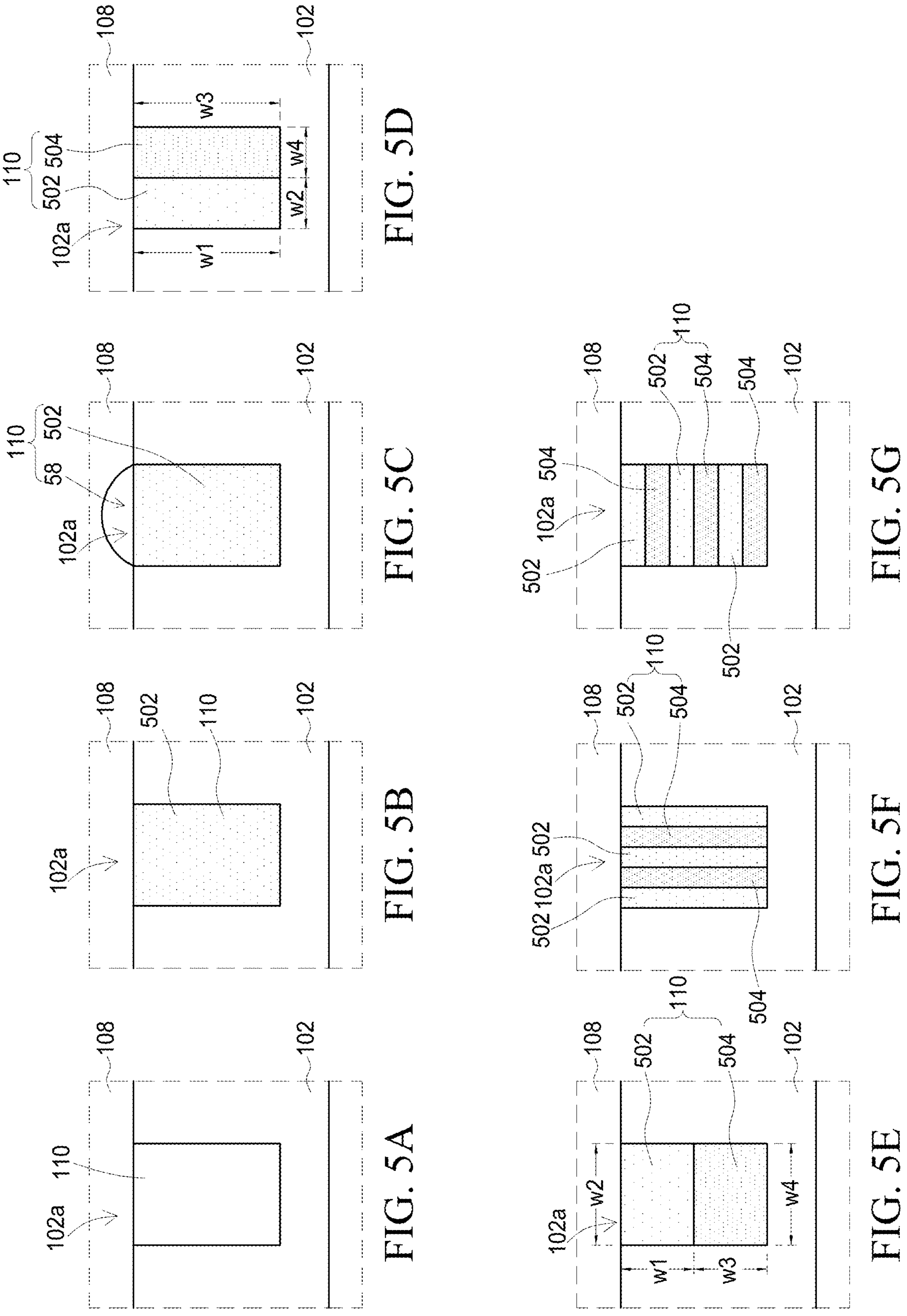
FIGS. 5A-5G respectively show schematic sectional views of a hole in a semiconductor device in accordance with an embodiment of the present disclosure.

As shown in FIG. 5A, the first hole 102*a* may be filled with gas to form the first dielectric structure 110. That is, in the embodiment, the material of the first dielectric structure 110 is a gas, such as air, nitrogen, helium or argon. In the embodiment, when the first semiconductor layer 102 is an AlGaAs layer (n=3.2) and the material of the first dielectric structure 110 is air (n=1.0), the first refractive index difference is 2.2.

In FIG. 5B, the first dielectric structure 110 is solid and only includes a first dielectric layer 502 filled in the first hole 102*a*. In the embodiment, when the first semiconductor layer 102 is an AlGaAs layer (n=3.2) and the material of the first dielectric structure 110 is $SiO_2$ (for example, n=1.4), the first refractive index difference is 1.8.

In FIG. 5C, the first dielectric structure 110 includes a solid and a gas. In detail, the first dielectric layer 502 is filled in the first hole 102*a*, and there is a void 58 between the first dielectric layer 502 and a semiconductor layer formed thereon (such as the second semiconductor layer 108 or the sixth semiconductor layer 120 in the foregoing embodiments). In an embodiment, a gas (such as air, nitrogen, helium, or argon) may be present in the void 58. The void 58 may be formed in the epitaxial regrowth process. In this embodiment, an equivalent refractive index of the first dielectric structure 110 can also be calculated by summing the values obtained by multiplying the refractive index of each dielectric material by its volume ratio (%) in the first dielectric structure 110. For example, when the void 58 contains air (n=1) and occupies 5% of the total volume, and the material of the first dielectric layer 502 is $SiO_2$ (for example, n=1.4) and occupies 95% of the total volume, then the equivalent refractive index of the first dielectric structure 110 is 1*5%+1.4*95%=0.05+1.33=1.38, and when the first semiconductor layer 102 is an AlGaAs layer (n=3.2), the first refractive index difference is 3.2-1.38=1.82.

In FIG. 5D, the first dielectric structure 110 is solid and includes a first dielectric layer 502 and a second dielectric layer 504. The first dielectric layer 502 and the second dielectric layer 504 are filled in the first hole 102*a*. Specifically, the first dielectric layer 502 has a first width w1 in the vertical direction (i.e., the epitaxial growth direction E1 or E3), and has a second width w2 in a horizontal direction. The second width w2 can be smaller than the first width w1. The second dielectric layer 504 has a third width w3 in the vertical direction and a fourth width w4 in the horizontal direction. The fourth width w4 can be smaller than the third width w3. In the embodiment, the first width w1 is equal to the third width w3. In FIG. 5D, the first dielectric layer 502 and the second dielectric layer 504 are arranged parallel to each other along the horizontal direction. The upper surfaces of the first dielectric layer 502 and the second dielectric layer 504 are close to the opening of the first hole 102*a* or a semiconductor layer (such as the second semiconductor layer 108 or the sixth semiconductor layer 120) formed thereon. The first dielectric layer 502 and the second dielectric layer 504 may be in direct contact with the semiconductor layer (such as the second semiconductor layer 108 or the sixth semiconductor layer 120) formed thereon. With the configuration as shown in FIG. 5D, the resonance of light emitted from the active region 114 in the horizontal direction can be increased. In the embodiment, when the first semiconductor layer 102 is an AlGaAs layer (n=3.2), the material of the first dielectric layer 502 is $SiO_2$ (for example, n=1.4), and the material of the second dielectric layer 504 is $SiN_x$ (for example, n=2.0), the equivalent refractive index is 1.4*50%+2*50%=0.7+1=1.7 and the first refractive index difference is 1.5.

In FIG. 5E, the first dielectric structure 110 is solid and includes a first dielectric layer 502 and a second dielectric layer 504. The first dielectric layer 502 and the second dielectric layer 504 are filled in the first hole 102*a*. In detail, the second dielectric layer 504 is located under the first dielectric layer 502. In this embodiment, the first dielectric layer 502 and the second dielectric layer 504 are arranged parallel to each other along the vertical direction. The first dielectric layer 502 is closer to the opening of the first hole 102*a* or a semiconductor layer (such as the second semiconductor layer 108 or the sixth semiconductor layer 120) formed thereon than the second dielectric layer 504 is. The first dielectric layer 502 is in direct contact with the semiconductor layer formed thereon, and the second dielectric layer 504 is not in direct contact with the semiconductor layer formed thereon. In FIG. 5E, the first width w1 is smaller than the second width w2 of the first dielectric layer 502, and the third width w3 is smaller than the fourth width w4 of the second dielectric layer 504. In this embodiment, the second width w2 is equal to the fourth width w4. With the configuration shown in FIG. 5E, the resonance of light emitted from the active region 114 in the vertical direction can be increased, thereby further improving the light-emitting quality (for example, the Q-factor can be elevated). Similarly, in this embodiment, when the first semiconductor layer 102 is an AlGaAs layer (n=3.2), the material of the first dielectric layer 502 is $SiO_2$ (for example, n=1.4), and the material of the second dielectric layer 504 is $SiN_x$ (for example, n=2.0), the equivalent refractive index is 1.4*50%+2*50%=0.7+1=1.7 and the first refractive index difference is 1.5.

In FIGS. 5F and 5G, the first dielectric structure 110 is solid and includes a plurality of first dielectric layers 502 and a plurality of second dielectric layers 504. The first dielectric layers 502 and the second dielectric layers 504 are filled in the first hole 102*a*. Specifically, the first dielectric layers 502 and the second dielectric layers 504 are alternately stacked. In FIG. 5F, the first dielectric layers 502 and the second dielectric layers 504 are stacked in the horizontal direction. In FIG. 5G, the first dielectric layers 502 and the second dielectric layers 504 are stacked in the vertical direction. In some embodiments, stacking the plurality of first dielectric layers 502 and the plurality of second dielectric layers 504 along the horizontal direction may improve resonance of light in the horizontal direction, and when the semiconductor device is a laser diode device, it may speed up the generation of lasing emission, and lower the threshold for lasing emission. Similarly, stacking the plurality of first dielectric layers 502 and the plurality of second dielectric layers 504 along the vertical direction may improve resonance of light in the vertical direction, and when the semiconductor device is a laser diode device, it may also lower the threshold for lasing emission. In FIGS. 5F and 5G, when the first semiconductor layer 102 is an AlGaAs layer (n=3.2), the material of the first dielectric layer 502 is $SiO_2$ (for example, n=1.4), and the material of the second dielectric layer 504 is $SiN_x$ (for example, n=2.0), the equivalent refractive index is 1.4*0.6%+2*0.4%=0.84+0.8=1.64 and the first refractive index difference is 1.56.

Based on the above, it is helpful for the generation of lasing emission by increasing the resonance of light in the horizontal or vertical direction. In some embodiments, through the configurations as mentioned above, an epitaxial structure originally applied for a light emitting diode (LED) can be used to emit coherent light, and can be used in a laser device.

According to some embodiments, the void 58 shown in FIG. 5C also exists between the first dielectric layer 502 (and/or the second dielectric layer 504) and the semiconductor layer formed thereon as shown in FIGS. 5D to 5G.

The material of the first dielectric layer 502 and the second dielectric layer 504 can be selected based on the wavelength of light generated or absorbed by the active region 114. The first dielectric layer 502 may have a first refractive index n1, and the second dielectric layer 504 may have a second refractive index n2 which is different from the first refractive index n1. In addition, although the interface between the first dielectric layer 502 and the second dielectric layer 504 is illustrated by a straight line in FIGS. 5B to 5E, in fact, the interface may be uneven. There may be a third refractive index difference Δn between the material of the first dielectric layer 502 and the material of the second dielectric layer 504. The third refractive index difference Δn is, for example, in a range from more than 0 to less than 1. The material of the first dielectric layer 502 and the second dielectric layer 504 may include an oxide (such as $TiO_2$, $Al_2O_3$ or $SiO_2$), a nitride (such as $SiN_x$), a fluoride (such as $MgF_2$) or combinations thereof.

As mentioned above, the configurations of the first dielectric layer 502 and the second dielectric layer 504 shown in FIGS. 5D to 5G can also be applied to the plurality of first dielectric structures 110' and/or a plurality of second dielectric structures 122' which are formed by a mask layer containing the dielectric material. Specifically, the mask layer including the configurations of the first dielectric layer 502 and/or the second dielectric layer 504 as shown in any one of FIG. 5B and FIG. 5D to FIG. 5G can be formed first, then the mask layer is patterned to form the first dielectric structure 110' and/or the plurality of second dielectric structures 122' while the producing processes can be found in the descriptions of FIGS. 2A to 2G. It should be noted that, in the embodiment of FIG. 2G, the first dielectric structures 110' are embedded in the second semiconductor layer 108, and the second dielectric structures 122' are embedded in the sixth semiconductor layer 120. Therefore, in this embodiment, the first refractive index difference should be the refractive index difference between the first dielectric structure 110' and the second semiconductor layer 108, and the second refractive index difference should be the refractive index difference between the second dielectric structure 122' and the six semiconductor layers 120. Similarly, when the first dielectric structure 110' (or the second dielectric structure 122') includes two or more kinds of dielectric materials, the equivalent refractive index of the first dielectric structure 110' (or the second dielectric structure 122') can be obtained by the method as described above, and then the first refractive index difference (or the second refractive index difference) can be calculated. The detailed descriptions of positions, relative relationships and material of other layers or structures as well as structural variations in this embodiment can be referred to the foregoing embodiments can be referred to and are not repeatedly described herein.

Figure 6A:
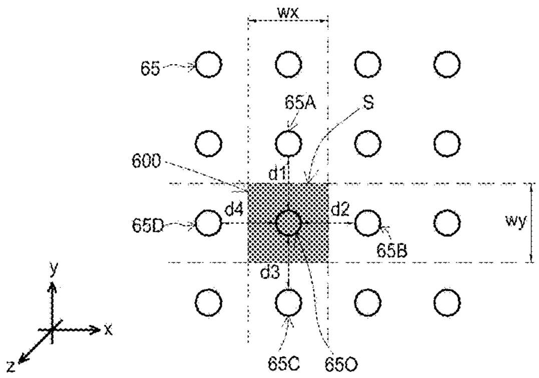
FIGS. 6A-6B, 6C-6D, 6E-6F, 6G-6H, 6I, 6J, 6K and 6L respectively show a schematic top views of a pattern formed by a plurality of holes in accordance with an embodiment of the present disclosure.

FIG. 6A shows a schematic top view of a pattern formed by a plurality of first holes 102*a* (or a plurality of second holes 118*a*) in accordance with an embodiment of the present disclosure. For ease of understanding, in FIG. 6A, a numeral 65 represents the plurality of first holes, and specific first holes are marked with numerals 65O, 65A, 65B, 65C, and 65D. Specifically, the pattern shown in FIG. 6A is formed by repeatedly arranging the plurality of first holes 65 along the x-direction and the y-direction.

As shown in FIG. 6A, atop-view shape of each of the first holes 65 is approximately circular, and the positions of the first holes 65 in each row and each column are respectively aligned in the x-direction and the y-direction. As shown in FIG. 6A, in this arrangement, the first hole 65O is surrounded by other holes. Specifically, there are four holes adjacent to and closest to the first hole 65O. The four holes are the first hole 65A, the first hole 65B, the first hole 65C and the first hole 65D. The first hole 65O is adjacent to the first hole 65A and the first hole 65C in the y-direction. The first hole 65O is adjacent to the first hole 65B and the first hole 65D in the x-direction. There are a first spacing d1 between the first hole 65O and the first hole 65A, a second spacing d2 between the first hole 65O and the first hole 65B, a third spacing d3 between the first hole 65O and the first hole 65C, and a fourth spacing d4 between the first hole 65O and the first hole 65D. In the embodiment, the first spacing d1, the second spacing d2, the third spacing d3 and the fourth spacing d4 are respectively the minimum distances between the first holes 65O and 65A, the first holes 65O and 65B, the first holes 65O and 65C and the first holes 65O and 65D. Lengths of the first spacing d1, the second spacing d2, the third spacing d3, and the fourth spacing d4 may be approximately equal. In an embodiment, the first spacing d1, the second spacing d2, the third spacing d3 and the fourth spacing d4 are in the range of 50 nm to 2 μm. For example, the first spacing d1, the second spacing d2, the third spacing d3, and the fourth spacing d4 may be greater than or equal to 100 nm and less than or equal to 1 μm.

As shown in FIG. 6A, a unit pattern 600 can be defined by perpendicular bisectors passing through the midpoints of the line segments that represent the first spacing d1, the second spacing d2, the third spacing d3, and the fourth spacing d4. For ease of understanding, the boundary of the unit pattern 600 can be indicated by dotted lines S. However, those skilled in the art should understand that in fact the boundary of the unit pattern 600 does not have a solid line. The unit pattern 600 may have a polygonal shape. In the embodiment, the shape of the unit pattern 600 is rectangular and has a length wx and a width wy. The length wx and the width wy may be approximately equal, that is, the shape of the unit pattern 600 is square. When the light emitted from the active region 114 of the semiconductor device has a wavelength of λ nm, the length wx and the width wy may be in the range of 0.1*λ nm to 10*λ nm (such as 0.2*λ nm to 0.5*λ nm). By setting the length and width of the unit pattern 600 within the above range, the luminance characteristics of light emitted from the active region 114 may be easily manipulated (for example, a light-emitting angle may be changed). In an embodiment, similarly, the first spacing d1, the second spacing d2, the third spacing d3 and the fourth spacing d4 may be in the range of 0.1*λ nm to 10*λ nm (such as 0.2*λ nm to 0.5*λ nm). By setting the spacings in within the above range, the luminance characteristics of light emitted from the active region 114 may be easily manipulated.

Figure 6B:
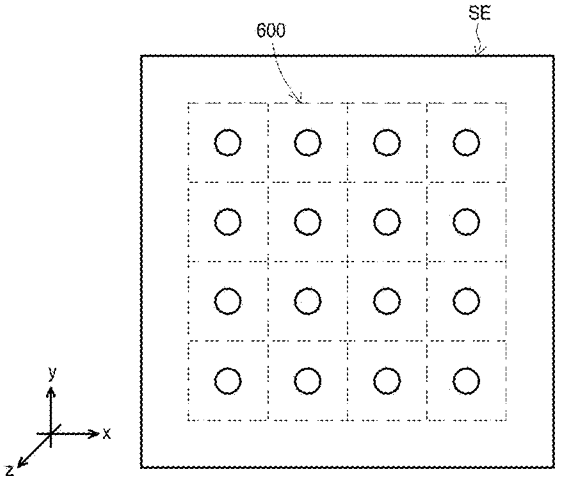

Specifically, the pattern shown in FIG. 6A can be formed by repeatedly arranging a plurality of unit patterns 600 along the x-direction and the y-direction. FIG. 6B shows the boundaries of the plurality of unit patterns 600 defining by above-mentioned manner with respect to the plurality of first holes 65 in FIG. 6A. It should be noted that, for ease of understanding, only 16 unit patterns 600 are shown here. According to some embodiments, in the semiconductor structure (such as the first semiconductor structure 10 or the third semiconductor structure 30), the number of the unit patterns 600 can be 1000 or more, even 10000 or more, and can be 16000000 or less, such as 8000000 or less.

The solid line SE in FIG. 6B represents the profile of a semiconductor structure (such as the first semiconductor structure 10 or the third semiconductor structure 30) projected on the xy plane along the z direction. The semiconductor structure includes the plurality of first holes 65. According to an embodiment, the ratio of the total projected area of all the unit patterns 600 to the projected area of the semiconductor structure (i.e., the area defined by the solid line SE) is not less than 80%. For example, the ratio is in a range between 90% % to 100%. In addition, an equivalent refractive index of the unit pattern 600 can be estimated by a formula. For example, in an unit pattern 600, the first hole 65 is filled with material having a refractive index na, A is an area of the first hole 65 projected on the xy plane along the z direction, B is an area difference obtained by deducting the area of the first hole 65 from the area of the unit pattern 600, the semiconductor structure (such as the first semiconductor structure 10 or the third semiconductor structure 30) has a refractive index nb, then the equivalent refractive index of the unit pattern 600 is equal to $\sqrt{A \cdot na \leftrightarrows B \cdot nb}$. In an embodiment, the equivalent refractive index of the unit pattern 600 may be in the range of 1 to 4. In an embodiment, the ratio of the area of the first hole 65 (A) to the area of the unit pattern 600 (A+B) (that is, A/(A+B)) may be within a range of 5% or more and less than or equal to 90%.

Figure 6C:
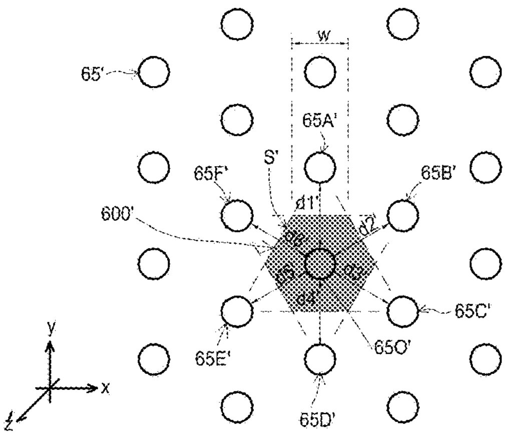

FIG. 6C shows a schematic top view of a pattern formed by a plurality of first holes 102*a* (or a plurality of second holes 118*a*) in accordance with another embodiment of the present disclosure. For ease of understanding, in FIG. 6C, a numeral 65' represents the plurality of first holes, and specific first holes are marked with numerals 65O', 65A', 65B', 65C', 65D', 65E' and 65F'. Specifically, the pattern shown in FIG. 6C is formed by repeatedly arranging the plurality of first holes 65' along the x-direction and the y-direction.

Different from the embodiment of FIG. 6A, in the embodiment of FIG. 6C, the holes are staggered in two adjacent rows or columns, that is, the plurality of first holes 65' are arranged in a staggered manner. As shown in FIG. 6C, in this arrangement, the first hole 65O' is surrounded by other holes. Specifically, there are six holes adjacent to and closest to the first hole 65O'. The six holes are a first hole 65A', a first hole 65B', a first hole 65C', a first hole 65D', a first hole 65E', and a first hole 65F'. There are a first spacing d1' between the first hole 65O' and the first hole 65A', a second spacing d2' between the first hole 65O' and the first hole 65B', a third spacing d3' between the first hole 65O' and the first hole 65C', a fourth spacing d4' between the first hole 65O' and the first hole 65D', a fifth spacing d5' between the first hole 65O' and the first hole 65E', and a sixth spacing d6' between the first hole 65O' and the first hole 65F'. In an embodiment, the first spacing d1', the second spacing d2', the third spacing d3', the fourth spacing d4', the fifth spacing d5' and the sixth spacing d6' are in the range of 50 nm to 2 μm. For example, the first spacing d1', the second spacing d2', the third spacing d3', the fourth spacing d4', the fifth spacing d5', and the sixth spacing d6' may be greater than or equal to 100 nm and less than or equal to 1 μm.

Figure 6D:
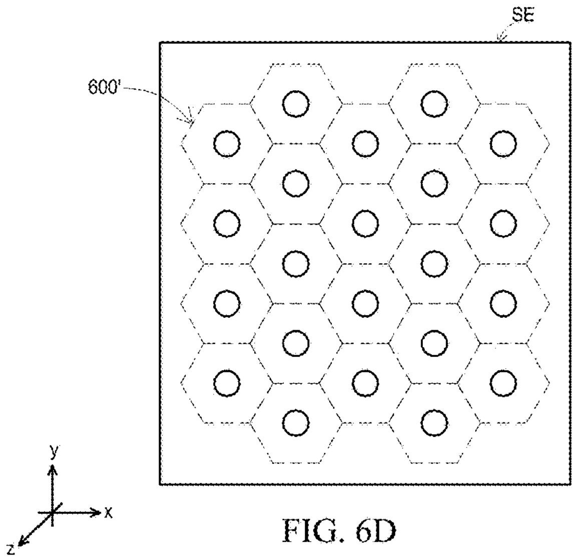

As shown in FIG. 6C, a unit pattern 600 can be defined by perpendicular bisectors passing through the midpoints of the line segments that represent the first spacing d1', the second spacing d2', the third spacing d3', the fourth spacing d4', the fifth spacing d5' and the sixth spacing d6'. For ease of understanding, the boundary of the unit pattern 600' can be indicated by dotted lines S'. However, those skilled in the art should understand that in fact the boundary of the unit pattern 600' does not have a solid line. In the embodiment, the profile of the unit pattern 600' is a regular hexagon and has a side length w. When the light emitted from the active region 114 of the semiconductor device has a wavelength of λ nm, the side length w may be in the range of 0.1*λ nm to 10*λ nm (such as 0.2*λ nm to 0.5*λ nm). By setting the side length of the unit pattern 600' within the above range, the luminance characteristics of light emitted from the active region 114 may be easily manipulated. Specifically, the pattern shown in FIG. 6C can be formed by repeatedly arranging a plurality of unit patterns 600' along the x-direction and the y-direction. FIG. 6D shows the boundaries of the plurality of unit patterns 600' defining by above-mentioned manner based on FIG. 6C. The main difference between FIG. 6D and FIG. 6B is that the shape of the unit pattern 600' in FIG. 6D is a regular hexagon. The detailed descriptions of the number, area ratio, or equivalent refractive index of the unit pattern can be referred to the foregoing embodiments and are not repeatedly described herein.

Figure 6E:
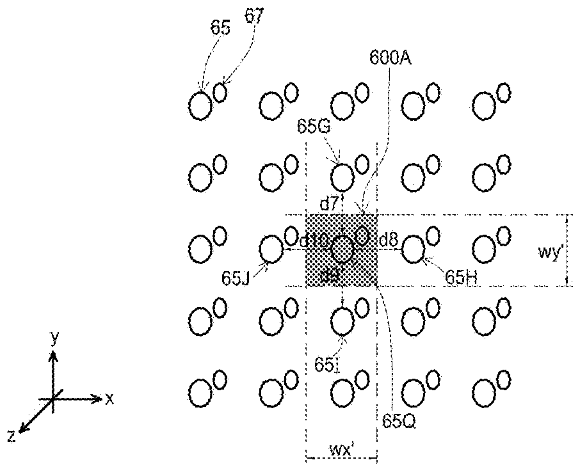
Figure 6F:
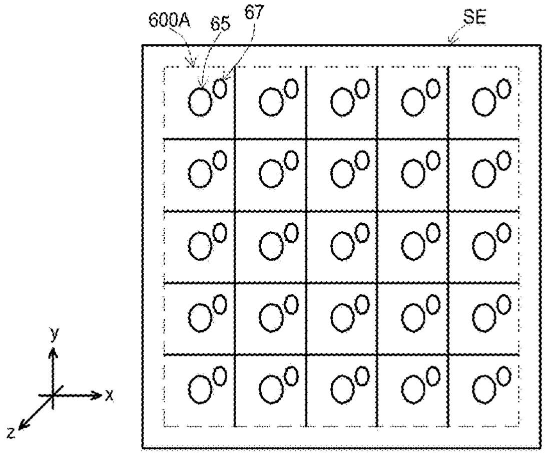

FIG. 6E shows a schematic top view of a pattern formed by a plurality of first holes 102*a* (or a plurality of second holes 118*a*) in accordance with another embodiment of the present disclosure. For ease of understanding, in FIG. 6E, a numeral 65 represents the plurality of first holes, and specific first holes are marked with numerals 65Q, 65G, 65H, 65I, and 65J. In this embodiment, in addition to the first holes 65, the semiconductor device further includes a plurality of third holes 67. Specifically, the pattern shown in FIG. 6E is formed by repeatedly arranging the first holes 65 and the third holes 67 and along the x-direction and the y-direction. In this arrangement, a unit pattern 600A can be defined by the first holes 65. The first hole 65Q is surrounded by other holes, and there are four holes adjacent to and closest to the first hole 65Q (i.e. the first holes 65G, 65H, 65I and 65J). As mentioned in previous embodiments, a unit pattern 600A can be defined by finding the minimum distances between the first hole 65Q and the first holes 65G, 65H, 65I and 65J (i.e., the seventh spacing d7, the eighth spacing d8, the ninth spacing d9 and the tenth spacing d10), and drawing perpendicular bisectors passing through the midpoints of the line segments that represent the seventh spacing d7, the eighth spacing d8, the ninth spacing d9 and the tenth spacing d10. Lengths of the seventh spacing d7, the eighth spacing d8, the ninth spacing d9 and the tenth spacing d10 may be approximately equal. Lengths of the seventh spacing d7 to the tenth spacing d10 may be in the range of 50 nm to 2 μm. For example, the seventh spacing d7, the eighth spacing d8, the ninth spacing d9 and the tenth spacing d10 may be greater than or equal to 100 nm and less than or equal to 1 μm. FIG. 6F shows the boundaries of the plurality of unit patterns 600A defining by above-mentioned manner based on FIG. 6E. In this embodiment, each unit pattern 600A includes one of the first holes 65 and one of the third holes 67. Similarly, if the unit pattern 600A is defined by the third holes 67, each unit pattern 600A includes one of the first holes and one of the third holes.

As shown in FIG. 6F, in the embodiment, the first hole 65 is symmetrically distributed with respect to the geometric center of the unit pattern 600A, and the third hole 67 is asymmetrically distributed with respect to the geometric center of the unit pattern 600A. In the unit pattern 600A, the third hole 67 and the first hole 65 are separated from each other. The top-view area of the third hole 67 and the first hole 65 may be different. For example, in this embodiment, the top-view area of the third hole 67 is smaller than the top-view area of the first hole 65. The shape of the third hole 67 may be a rectangle, a circle (or a part thereof), an ellipse (or a part thereof), or other polygons (or a part thereof). In an embodiment, the first hole 65 and the third hole 67 may have different shapes.

The main difference between the unit pattern 600A and the unit pattern 600 is that the unit pattern 600A further includes the third hole 67 in addition to the first hole 65. The third hole 67 in the unit pattern 600A is asymmetrically distributed with respect to the geometric center of the unit pattern 600A.

Figure 6G:
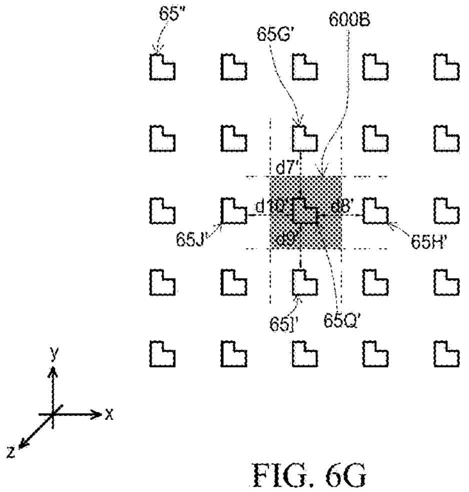
Figure 6H:
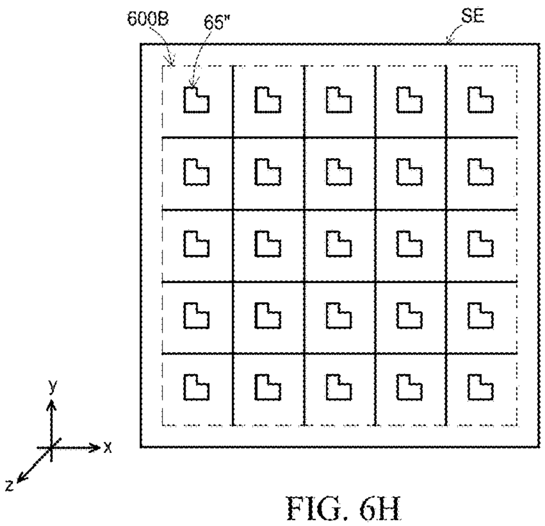

FIGS. 6G and 6H show schematic top views of a pattern formed by a plurality of first holes 102*a* (or a plurality of second holes 118*a*) in accordance with another embodiment of the present disclosure. For ease of understanding, the numeral 65" in FIG. 6G represents a plurality of first holes, and specific first holes are marked with numerals 65Q', 65G', 65H', 65I', and 65J'. As mentioned in previous embodiments, a unit pattern 600B can be defined by finding the minimum distances between the first hole 65Q' and the first holes 65G', 65H', 65I' and 65J' (i.e., the seventh spacing d7', the eighth spacing d8', the ninth spacing d9' and the tenth spacing d10'), and drawing perpendicular bisectors passing through the midpoints of the line segments that represent the seventh spacing d7', the eighth spacing d8', the ninth spacing d9' and the tenth spacing d10'. Lengths of the seventh spacing d7', the eighth spacing d8', the ninth spacing d9' and the tenth spacing d10' may be approximately equal. Lengths of the seventh spacing d7' to the tenth spacing d10' may be in the range of 50 nm to 2 μm. For example, the seventh spacing d7', the eighth spacing d8', the ninth spacing d9' and the tenth spacing d10' may be greater than or equal to 100 nm and less than or equal to 1 μm. FIG. 6H shows the boundaries of the plurality of unit patterns 600B defining by above-mentioned manner based on FIG. 6G.

The main difference between the unit pattern 600B and the unit pattern 600 is that the first hole 65 in each unit pattern 600 has a symmetrical shape (that is, the shape of the first hole 65 is point-symmetric or line-symmetric), while the first hole 65" in each unit pattern 600B has an asymmetrical shape (that is, the shape of the first hole 65" is non-point-symmetric or non-line-symmetric). For example, the shape of the first hole 65" is an asymmetric polygon in the embodiment. The detailed descriptions of the number, area ratio, or equivalent refractive index of the unit pattern can be referred to the foregoing embodiments and are not repeatedly described herein.

As described above, the shapes of the unit patterns and the holes may be the same or different. In addition to being circular, the shape of the hole can be rectangular (or a part thereof), oval (or a part thereof), other polygons (or a part thereof). Specifically, the unit pattern may include single or multiple holes symmetrically or asymmetrically distributed with respect to the geometric center of the unit pattern, or may include single or multiple holes with symmetrical or asymmetric shapes. According to some embodiments, when the unit pattern further includes a single or multiple holes distributed asymmetrically with respect to its geometric center (such as the third hole 67 in the unit pattern 600A), or the unit pattern includes single or multiple holes that has an asymmetric shape (such as the first hole 65" in the unit pattern 600B), destructive interferences between lights resonated on the xy plane may be reduced, and the luminous power of the semiconductor device may be further improved.

Figure 6I:
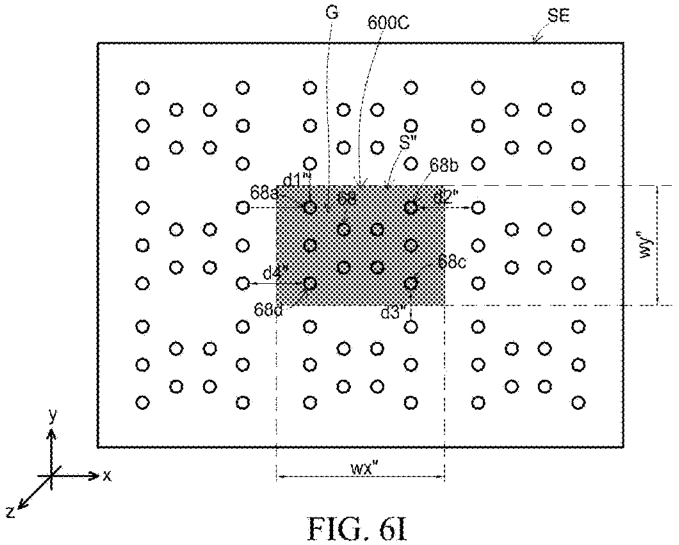
Figure 6J:
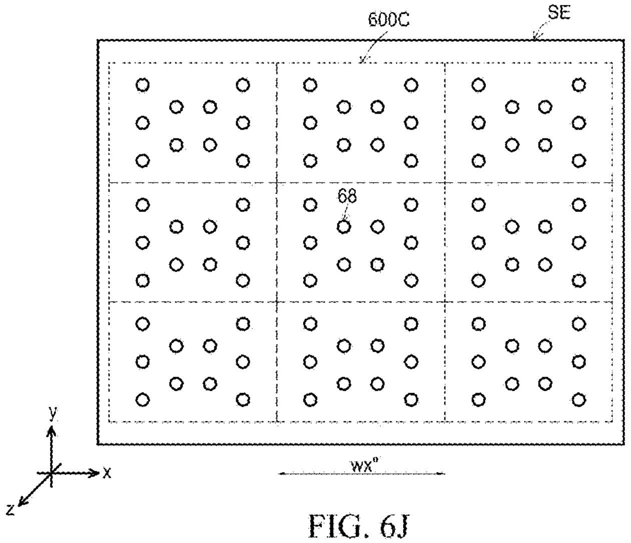

FIG. 6I is a schematic top view of a plurality of first holes 102*a* (or a plurality of second holes 118*a*) arranged in a pattern in a semiconductor device according to another embodiment of the present disclosure. For ease of understanding, the numeral 68 in FIG. 6I represents a plurality of first holes, and specific first holes are marked with numerals 68*a*, 68*b*, 68*c*, and 68*d*. In the embodiment, a plurality of first holes 68 are defined as a group G. Specifically, the pattern shown in the embodiment can be formed by repeatedly arranging the group G along the x-direction and the y-direction. In FIG. 6I, there are 10 first holes in the group G. As shown in FIG. 6I, in the group G, the most upper left hole is the first hole 68*a*, the most upper right hole is the first hole 68*b*, the most lower right hole is the first hole 68*c*, and the most lower left hole is the first hole 68*d*, the minimum distance between the first hole 68*a* and an adjacent hole in the +y direction is the first spacing d1", the minimum distance between the first hole 68*b* and an adjacent hole in the +x direction is the second spacing d2', the minimum distance between the first hole 68*c* and an adjacent hole in the −y direction is the third spacing d3", and the minimum distance between the first hole 68*d* and an adjacent hole in the −x direction is the fourth spacing d4". As mentioned in previous embodiments, a unit pattern 600C can be defined by drawing perpendicular bisectors passing through the midpoints of the line segments that represent the first spacing d1", the second spacing d2", the third spacing d3", and the fourth spacing d4". The lengths of the first spacing d1", the second spacing d2", the third spacing d3" and the fourth spacing d4" may be the same or different. For example, the first spacing d1", the second spacing d2", the third spacing d3", and the fourth spacing d4" may be greater than or equal to 100 nm and less than or equal to 1 μm. Specifically, the pattern shown in FIG. 6I can be formed by repeatedly arranging the plurality of unit patterns 600C along the x-direction and the y-direction. The boundary S" of each unit pattern in FIG. 6I has a rectangular shape. FIG. 6J shows the boundary of the plurality of unit patterns 600C defining by above-mentioned manner based on FIG. 6I. The detailed descriptions of the number, area ratio, or equivalent refractive index of the unit pattern can be referred to the foregoing embodiments and are not repeatedly described herein.

Figure 6K:
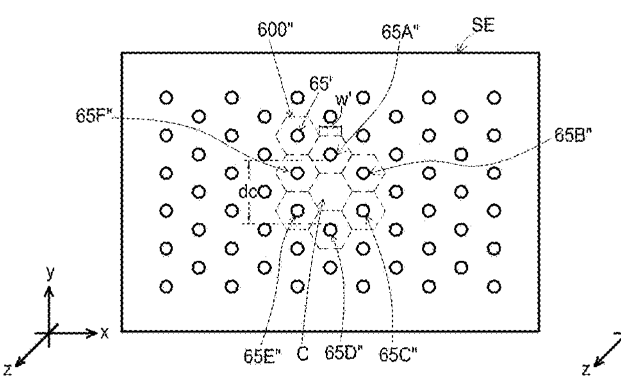

In this embodiment, each unit pattern 600C has a length wx" and a width wy". The length wx" and the width wy" can be the same or different. When the light emitted from the active region 114 has a wavelength of λ nm, the length wx" and the width wy" may be in the range of 0.1*λ nm to 10*λ nm (such as 0.2*λ nm to 0.5*λ nm). According to some embodiments, by setting the length and width of each unit pattern 600C within the above-mentioned ranges, destructive interferences between lights resonated on the xy plane may be reduced so that the luminance characteristics of light emitted from the active region 114 can be manipulated. FIG. 6K shows a schematic top view of a pattern formed by a plurality of first holes 102*a* (or a plurality of second holes 118*a*) in accordance with another embodiment of the present disclosure. Specifically, the embodiment of FIG. 6K is similar to the embodiment of FIG. 6C, except that the embodiment of FIG. 6K includes one or more cavity regions C. In other words, when defining the unit pattern 600" based on the foregoing manner, there is one or more unit patterns 600" that do not have any hole (such as the first hole (or the second hole) and the third hole). The cavity region C can serve as a resonant cavity for light, thereby regulating the modes of light emitted from the active region 114. In the embodiment, the holes 65A" to 65F" surround the cavity region C and are closest to the cavity region C. As shown in FIG. 6K, the cavity region C may have a maximum length dc greater than the side length w' of each unit pattern 600". The maximum length dc can be viewed as the maximum length of the resonant cavity. Specifically, among the holes (i.e., holes 65A" to 65F" in this embodiment) that are closest to the cavity region C, the maximum length dc can be defined as the maximum distance between two holes that are symmetrical with respect to the geometric center of the unit pattern 600" which does not have any holes. In this embodiment, the maximum length dc is larger than √3 times of the side length w' of the unit pattern 600" and is smaller than 3√3 times of the side length w' of the unit pattern 600". The structure of the embodiment may be applied to a laser device. For other details of this embodiment, the foregoing embodiments can be referred to and are not repeatedly described herein.

Figure 6L:
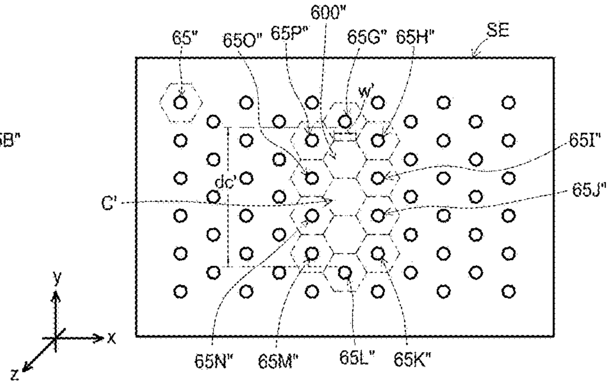

FIG. 6L shows a schematic top view of a pattern formed by a plurality of first holes 102*a* (or a plurality of second holes 118*a*) in accordance with another embodiment of the present disclosure. As shown in FIG. 6L, the semiconductor device includes a plurality of unit patterns 600" that does not have any hole (such as the first hole (or the second hole) and the third hole) and thus has a cavity regions C'. Specifically, the semiconductor device shown in FIG. 6L includes 3 unit patterns 600" that do not have any hole. In this embodiment, a plurality of unit patterns 600" is arranged parallel to they direction, so the cavity region C" is in a strip shape. In this embodiment, the holes 65G" to 65P" (i.e., holes 65G", 65H", 65I", 65J", 65K", 65L", 65M", 65N", 65O", 65P") surround the cavity region C' and are closest to the cavity region C'. In some embodiments, when the semiconductor device includes n unit patterns 600" that do not have any hole and arranged continuously, the maximum length dc' of the cavity region C' (i.e., the maximum length of the resonant cavity) is greater than n*√3 times of the side length w' the side of the unit pattern 600" and less than (n+2)*√3 times the side length w' of the unit pattern 600". The structure of this embodiment may be a waveguide for transmitting optical signals. For other details of this embodiment, the foregoing embodiments can be referred to and are not repeatedly described herein.

The unit patterns listed above are only examples, and the present disclosure is not limited thereto. Those skilled in the art should understand that, in fact, the holes may be covered inside the semiconductor device, thus FIGS. 6A-6L may be perspective views from above (or schematic views vertically projected on the xy plane along the z-axis). The detailed descriptions of positions, relative relationships and material of other layers or structures as well as structural variations in this embodiment can be referred to the foregoing embodiments and are not repeatedly described herein.

It should be realized that each of the embodiments mentioned in the present disclosure is used for describing the present disclosure, but not for limiting the scope of the present disclosure. Any obvious modification or alteration is not departing from the spirit and scope of the present disclosure. Furthermore, embodiments can be combined or substituted under proper condition and are not limited to specific embodiments described above. A connection relationship between a specific component and another component specifically described in an embodiment can also be applied in another embodiment and is within the scope as claimed in the present disclosure.

What is claimed is:

1. A semiconductor device, comprising:
- a substrate;
- a first semiconductor structure located on the substrate;
- a plurality of first holes periodically arranged in the first semiconductor structure;
- a first dielectric structure filled in one or more of the first holes; and
- a second semiconductor structure located on the first semiconductor structure;
- wherein the first dielectric structure comprises a first dielectric layer having a first refractive index and a second dielectric layer having a second refractive index different from the first refractive index.

2. The semiconductor device of claim 1, wherein the first dielectric structure comprises a plurality of the first dielectric layers and a plurality of the second dielectric layers which are alternately stacked.

3. The semiconductor device of claim 1, wherein in a sectional view of the semiconductor device, the first dielectric layer has a first width along a vertical direction and a second width along a horizontal direction, and the first width is different from the second width.

4. The semiconductor device of claim 1, further comprising a third semiconductor structure located on the second semiconductor structure.

5. The semiconductor device of claim 4, wherein the third semiconductor structure comprises a plurality of second holes that are periodically arranged.

6. The semiconductor device of claim 5, further comprising a second dielectric structure filled in one or more of the second holes.

7. The semiconductor device of claim 6, wherein the second dielectric structure comprises a third dielectric layer having a third refractive index and a fourth dielectric layer having a fourth refractive index different from the third refractive index.

8. The semiconductor device of claim 6, wherein the second dielectric structure comprises an oxide, a nitride, or a fluoride.

9. The semiconductor device of claim 1, wherein the first dielectric layer and the second dielectric layer are stacked along a vertical direction.

10. The semiconductor device of claim 1, wherein the first dielectric layer and the second dielectric layer comprise an oxide, a nitride, or a fluoride.

11. The semiconductor device of claim 1, wherein the first dielectric layer comprises a first solid and the second dielectric layer comprises a second solid.

12. The semiconductor device of claim 11, further comprising:
- a first electrode located on the second semiconductor structure; and
- a second electrode located under the substrate, wherein the second electrode is not overlapped with the first electrode in a vertical direction.

13. The semiconductor device of claim 1, wherein the second semiconductor structure comprises a plurality of well layers, and a distance between one of the well layers closest to one of the plurality of first holes and the one of the plurality of first holes is between 200 nm to 1 μm.

14. A semiconductor device, comprising:
- a substrate;

a first semiconductor layer located on the substrate;

a plurality of first holes periodically arranged in the first semiconductor layer;

a first material in the plurality of first holes and having a first refractive index;

a second material in the plurality of first holes and having a second refractive index different from the first refractive index; and a second semiconductor layer located on the first semiconductor layer.

15. The semiconductor device of claim 14, wherein the first material comprises a solid and the second material comprises a gas.

16. The semiconductor device of claim 14, wherein the first material comprises an oxide, a nitride, or a fluoride.

17. The semiconductor device of claim 14, wherein the second material is between the first material and the second semiconductor layer.

18. The semiconductor device of claim 14, further comprising a bonding structure between the substrate and the first semiconductor layer.

19. The semiconductor device of claim 14, wherein one of the plurality of first holes has a height of 10 nm to 10 μm.

* * * * *